(12) United States Patent
Yoon et al.

(10) Patent No.: US 12,293,801 B2
(45) Date of Patent: May 6, 2025

(54) MEMORY INTERFACE AND SEMICONDUCTOR MEMORY DEVICE AND SEMICONDUCTOR DEVICE INCLUDING THE SAME

(71) Applicant: SAMSUNG ELECTRONICS CO., LTD., Suwon-si (KR)

(72) Inventors: Hojun Yoon, Suwon-si (KR); Youngdon Choi, Suwon-si (KR); Seungjin Park, Suwon-si (KR); Seunghoon Lee, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/200,709

(22) Filed: May 23, 2023

(65) Prior Publication Data

US 2024/0170085 A1 May 23, 2024

(30) Foreign Application Priority Data

Nov. 17, 2022 (KR) .......................... 10-2022-0154813

(51) Int. Cl.
*G11C 29/12* (2006.01)
*G11C 7/22* (2006.01)
*G11C 8/18* (2006.01)
*H03K 5/156* (2006.01)

(52) U.S. Cl.
CPC ........ *G11C 29/12015* (2013.01); *G11C 7/222* (2013.01); *G11C 8/18* (2013.01); *H03K 5/1565* (2013.01)

(58) Field of Classification Search
CPC ..... G11C 29/12015; G11C 7/222; G11C 8/18; G11C 7/1066; G11C 7/1093; G11C 29/023; G11C 29/028; G11C 7/1078; G11C 2207/2254; H03K 5/1565
USPC .......................................................... 714/718
See application file for complete search history.

(56) References Cited

U.S. PATENT DOCUMENTS

| 6,570,944 | B2 * | 5/2003 | Best ...................... H04L 7/0337 375/360 |
| 6,985,041 | B2 | 1/2006 | Wong et al. |
| 7,627,066 | B2 * | 12/2009 | Best ......................... H03L 7/07 375/360 |
| 7,733,150 | B2 | 6/2010 | Takano |
| 7,823,031 | B2 * | 10/2010 | Kim ................. G11C 29/12015 714/707 |

(Continued)

FOREIGN PATENT DOCUMENTS

KR  10-1016555  B1  2/2011

*Primary Examiner* — James C Kerveros
(74) *Attorney, Agent, or Firm* — Muir Patent Law, PLLC

(57) ABSTRACT

A semiconductor device has a memory controller configured to provide a data strobe signal, and a memory device configured to receive a data signal provided from the memory controller or output a data signal to the memory controller, wherein the memory device includes a memory interface including a plurality of DQ driving circuits, the memory interface being configured to generate a plurality of phase clock signals based on the data strobe signal, determine a number of phase clock signals provided to the plurality of DQ driving circuits based on an operating frequency of the memory device, and provide the determined number of phase clock signals to the plurality of DQ driving circuits.

20 Claims, 21 Drawing Sheets

(56) References Cited

U.S. PATENT DOCUMENTS

| | | | |
|---|---|---|---|
| 7,840,831 B2 | 11/2010 | Jang | |
| 7,840,841 B2 | 11/2010 | Huang et al. | |
| 7,911,245 B2 | 3/2011 | Ma | |
| 8,004,336 B2 | 8/2011 | Yoon et al. | |
| 8,008,954 B2 | 8/2011 | Ma | |
| 8,138,799 B2 | 3/2012 | Hayashi | |
| 8,400,196 B2 | 3/2013 | Kim | |
| 8,797,076 B2 | 8/2014 | Kibune | |
| 9,413,344 B2 | 8/2016 | Bowman et al. | |
| 9,628,089 B1 | 4/2017 | Jain et al. | |
| 10,395,704 B2 | 8/2019 | Lee et al. | |
| 10,522,204 B1* | 12/2019 | Yu | G11C 29/028 |
| 10,587,250 B2 | 3/2020 | Hanke et al. | |
| 10,630,272 B1 | 4/2020 | Ashtiani et al. | |
| 2002/0159325 A1* | 10/2002 | Kashiwazaki | G11C 7/1045 365/233.1 |
| 2007/0120588 A1 | 5/2007 | Lim et al. | |
| 2015/0377967 A1* | 12/2015 | Thiruvengadam | G01R 31/31715 714/731 |
| 2016/0125929 A1* | 5/2016 | Best | G11C 7/222 365/193 |
| 2020/0059226 A1 | 2/2020 | Choi et al. | |
| 2020/0389158 A1 | 12/2020 | Kim et al. | |

\* cited by examiner

MEMORY INTERFACE AND SEMICONDUCTOR MEMORY DEVICE AND SEMICONDUCTOR DEVICE INCLUDING THE SAME

CROSS-REFERENCE TO RELATED APPLICATION

Korean Patent Application No. 10-2022-0154813, filed on Nov. 17, 2022, in the Korean Intellectual Property Office, is incorporated herein by reference in its entirety.

BACKGROUND

1. Field

A memory interface, a semiconductor memory device, and a semiconductor device including the same are disclosed.

2. Description of the Related Art

A semiconductor device comprises a semiconductor memory device and a memory controller.

SUMMARY

Embodiments are directed to a semiconductor device including a memory controller configured to provide a data strobe signal, a memory device configured to receive a data signal provided from the memory controller or output a data signal to the memory controller, a memory interface including a plurality of DQ driving circuits, generate a plurality of phase clock signals based on the data strobe signal, determine the number of phase clock signals provided to the plurality of DQ driving circuits based on an operating frequency of the memory device, and provide the determined number of phase clock signals to the plurality of DQ driving circuits.

Embodiments are directed to a semiconductor memory device including a memory cell array including a plurality of memory cells, a plurality of DQ driving circuits configured to convert data read from the memory cell array according to a plurality of clock signals to generate a data signal and sample a data signal received from the outside according to the plurality of clock signals to generate data written in the memory cell array, a clock selection circuit configured to provide at least one of a plurality of phase clock signals based on a data strobe signal received from the outside, an adaptive control circuit configured to determine the number of the at least one phase clock signal according to an operating frequency, and a plurality of clock generation circuits configured to receive the at least one phase clock signal to generate the plurality of clock signals.

Embodiments are directed to a memory interface including a DQ driving circuit configured to drive a data signal according to a plurality of clock signals, a clock division circuit configured to generate a plurality of phase clock signals based on a data strobe signal received from the outside, an adaptive control circuit configured to determine the number of phase clock signals transmitted to the DQ driving circuit among the plurality of phase clock signals according to an operating frequency, and a clock generation circuit configured to receive the determined number of phase clock signals and generating the plurality of clock signals.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
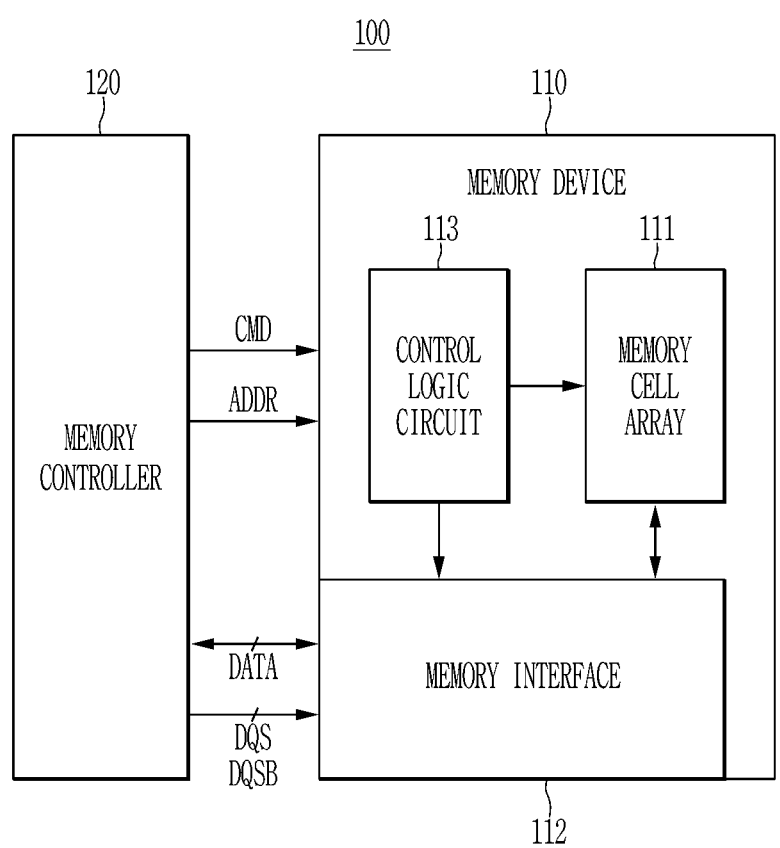
FIG. 1 is a block diagram of a semiconductor device according to an example embodiment.

FIG. 1 is a block diagram of a semiconductor device according to an example embodiment.

Referring to FIG. 1, a semiconductor device 100 may comprise a memory device 110 and a memory controller 120. In some embodiments, the memory device 110 and the memory controller 120 may be connected through a memory interface to transmit and receive signals through the memory interface.

The memory device 110 may include a memory cell array 111, a memory interface 112, and a control logic circuit 113. The memory cell array 111 may include a plurality of memory cells connected to a plurality of rows and a plurality of columns. In some embodiments, the rows may be defined by wordlines, and the columns may be defined by bitlines. The memory interface 112 may output data DATA stored in the memory cell array 111 to the outside of the memory device 110 (e.g., the memory controller 120), or store data DATA transmitted from the outside in the memory cell array 111. The control logic circuit 113 may control access to the memory cell array 111 and control on operation of the memory interface 112, based on a command CMD and an address ADDR.

The memory controller 120 may provide a signal to the memory device 110 to control a memory operation of the memory device 110. The signal may include the command CMD and the address ADDR. In some embodiments, the memory controller 120 may provide the command CMD and the address ADDR to the memory device 110 to access the memory cell array 111 and control the memory operation such as reading or writing. Data may be transmitted from the memory cell array 111 to the memory controller 120 according to a reading operation, and data may be transmitted from the memory controller 120 to the memory cell array 111 according to a writing operation.

The command CMD may comprise an activate command, a read/write command, and a refresh command. In some embodiments, the activate command may be a command for converting a target row of the memory cell array 111 to an active state in order to write data to or read data from the memory cell array 111. The memory cell of the target row may be activated (e.g., driven) in response to the activate command. The read/write command may be a command for performing a read or write operation on a target memory cell of a row switched to an active state. The command CMD may comprise information OFD on an operating frequency and information CSD on a channel state. The operating frequency may be an operating frequency of the memory device 110, such as a frequency for a reading operation to read data from the memory cell array 111 or a frequency for a writing operation of writing data to the memory cell array 111. The channel state, as information indicating a state of a plurality of signal channels formed between the memory controller 120 and the memory interface 112, may be information based on a width of an eye diagram for signals transmitted and received through the plurality of signal channels.

The memory controller 120 may provide data strobe signals DQS and DQSB and data signal DQ to the memory device 110, and may receive the data signal DATA from the memory device 110. The data strobe signal DQS and the data strobe signal DQSB may have inverted phases. The memory controller 120 may provide only the data strobe signal DQS to the memory device 110, and the memory device 110 may generate the data strobe signal DQSB by inverting the data strobe signal DQS. A plurality of channels is formed between the memory controller 120 and the memory interface 112, so that the data signals DQ may be provided to each other through each of the plurality of channels. The memory interface 112 may receive the data signal DATA to provide data of the data signal DATA to the memory cell array 111 to input the data thereto. In addition, the memory interface 112 may provide a data signal DATA according to data read from the memory cell array 111 to the memory controller 120.

In the embodiment, the memory interface 112 may generate N_P phase clock signals having N_P (an integer greater than or equal to 1) phases based on the data strobe signals DQS and DQSB received from the memory controller 120, and may determine whether to internally transmit and use N_Q (a natural number less than or equal to N_P) phase clock signals among the N_P clock signals based on information on the operating frequency OPD and information on the channel state CSD. The N_P phase clock signals may be clock signals required for the memory interface 112 to input and output data. The internal transmission may refer to transmission from a configuration in which N_P phase clock signals are generated in the memory interface 112 to a plurality of DQ driving circuits for driving data signals. The plurality of DQ driving circuits may receive or output a data signal through a DQ pad. The DQ driving circuit driving the data signal may include an operation of receiving a data signal through the DQ pad and an operation of outputting the data signal.

The memory interface 112 may include various devices using $2^n$ phase clock signals generated according to the number of divisions (n, n being an integer greater than or equal to 0). Hereinafter, for description of various embodiments, N_P phase clock signals will be described as four phase clock signals. $2^n$ phase clock signals may be applied to the memory interface 112.

In some embodiments, the memory controller 120 may access the memory device 110 according to a request from a host external to the memory system 100. The memory controller 120 may communicate with the host by using various protocols.

The memory device 110 may be a storage device based on a semiconductor device. In some embodiments, the memory device 110 may comprise a dynamic random access memory (DRAM), a double data rate 4 (DDR4), a synchronous DRAM (SDRAM), a low power DDR4 (LPDDR4) SDRAM, or an LPDDR5 SDRAM. In some embodiments, the memory device 110 may comprise a non-volatile memory device, such as a NAND, a 3D vertical NAND.

Figure 2:
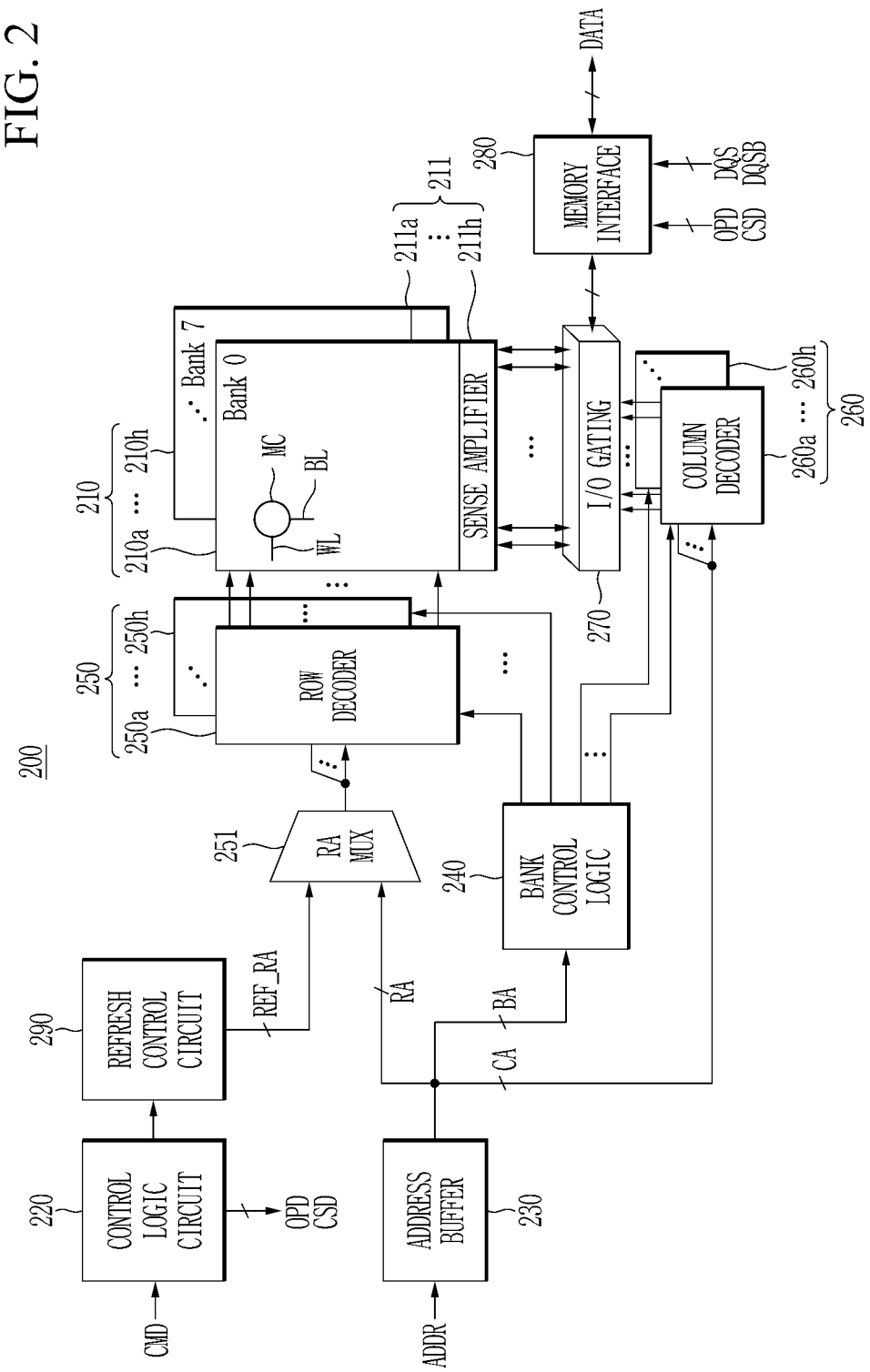
FIG. 2 is a block diagram of a semiconductor memory device according to an example embodiment.

FIG. 2 illustrates a block diagram of a semiconductor memory device according to an example embodiment.

Referring to FIG. 2, a semiconductor memory device (hereinafter, a memory device) 200 may include a memory cell array 210, a sense amplifier 211, a control logic circuit 220, an address buffer 230, a bank control logic 240, a row decoder 250, a column decoder 260, an I/O gating circuit 270, and a memory interface 280, and a refresh control circuit 290.

Each of a plurality of memory cell arrays 210 may include a plurality of memory cells (MC). In some embodiments, the plurality of memory cell arrays 210 may include eight memory cell arrays 210a to 210h, and each of the memory cell arrays may include a plurality of rows, a plurality of columns, and a plurality of memory cells (MC) arranged at intersections of the plurality of rows and the plurality of columns. In some embodiments, the plurality of rows may be defined by a plurality of wordlines (WL), and the plurality of columns may be defined by a plurality of bitlines (BL).

The control logic circuit 220 may control an operation of the memory device 200. In an implementation, the control logic circuit 220 may generate a control signal so that the memory device 200 may perform a reading operation, a writing operation, or a ZD calibration operation. In some embodiments, the control logic circuit 220 may decode a command CMD to generate a control signal. In an implementation, the control logic circuit 220 may decode information OPD on an operating frequency and information CSD on a channel state from a command CMD to provide the decoded information to the memory interface 280.

The address buffer 230 may receive the address ADDR provided by the memory controller 120. The address ADDR may include a row address RA indicating a row of the memory cell array 210 and a column address CA indicating a column thereof. The column address CA may be provided to the column decoder 260.

In some embodiments, the address ADDR may further include a bank address BA indicating a memory bank. The bank address BA may be provided to the bank control logic 240.

In some embodiments, the memory device 200 may further comprise the bank control logic 240 for generating a bank control signal in response to the bank address BA. The bank control logic 240 may activate a row decoder 250 corresponding to the bank address BA among a plurality of row decoders 250 and a column decoder 260 corresponding to the bank address BA among a plurality of column decoders 260, in response to the bank control signal.

In some embodiments, the memory device 200 may further include a row address multiplexer 251, and the refresh control circuit 290 may sequentially output row addresses REF_RA to be refreshed under control of the control logic circuit 220. The row address multiplexer 251 may receive the row address RA from the address buffer 230 and the row address REF_RA to be refreshed from the refresh control circuit 290. The row address multiplexer 251 may selectively output the row address RA received from the address buffer 230 and the row address REF_RA received from the refresh control circuit 290 to the row decoder 250.

The row decoder 250 may select a row to be activated among a plurality of rows of the memory cell array 210 based on the received row address (e.g., RA or REF_RA). To this end, the row decoder 250 may apply a driving voltage to a word line corresponding to a row to be activated. In some embodiments, a plurality of row decoders 250*a* to 250*h* corresponding to the plurality of memory banks 210*a* to 210*h* may be provided.

The column decoder 260 may select a column to be activated from a plurality of columns of the memory cell array 210 based on the column address CA. To this end, the column decoder 260 may activate the sense amplifier 211 corresponding to the column address CA through the I/O gating circuit 270. In some embodiments, a plurality of column decoders 260*a* to 260*h* respectively corresponding to the plurality of memory banks 210*a* to 210*h* may be provided. In some embodiments, the I/O gating circuit 270 gates may input/output data, and may comprise a data latch for storing data read from the memory cell array 210 and a write driver for writing data to the memory cell array 210. Data read from the memory cell array 210 may be sensed by the sense amplifier 211 and stored in the I/O gating circuit 270 (e.g., a data latch). In some embodiments, a plurality of sense amplifiers 211*a* to 211*h* respectively corresponding to the plurality of memory banks 210*a* to 210*h* may be provided.

In some embodiments, data read from the memory cell array 210 (e.g., data stored in the data latch) may be provided to the memory controller 120 through the memory interface 280. Data to be written to the memory cell array 210 may be provided from the memory controller 120 to the memory interface 280, and data provided to the memory interface 280 may be provided to the I/O gating circuit 270.

The memory interface 280 may receive the operating frequency information OPD and the channel state information CSD from the control logic circuit 220, and may receive the data strobe signals DQS and DQSB from the memory controller 120. The memory interface 280 may generate four phase clock signals having different phases generated by using data strobe signals DQS and DQSB. The memory interface 280 may determine whether to generate four clock signals required for data signal input and data signal output by using several (N_Q) phase clock signals of the four phase clock signals according to the operating frequency information OPD or the channel state information CSD. The memory interface 280 may restore four clock signals based on N_P phase clock signals, may convert data inputted to the memory interface 280 among data stored in the memory cell array 210 into the data signal DATA by using the four clock signals to provides it to the memory controller 120, and may sample and amplify the data signal DATA provided from the memory controller 120 to generate data to be written in the memory cell array 210. As used herein, the term "or" is not an exclusive term, e.g., "A or B" would include A, B, or A and B.

Figure 3:
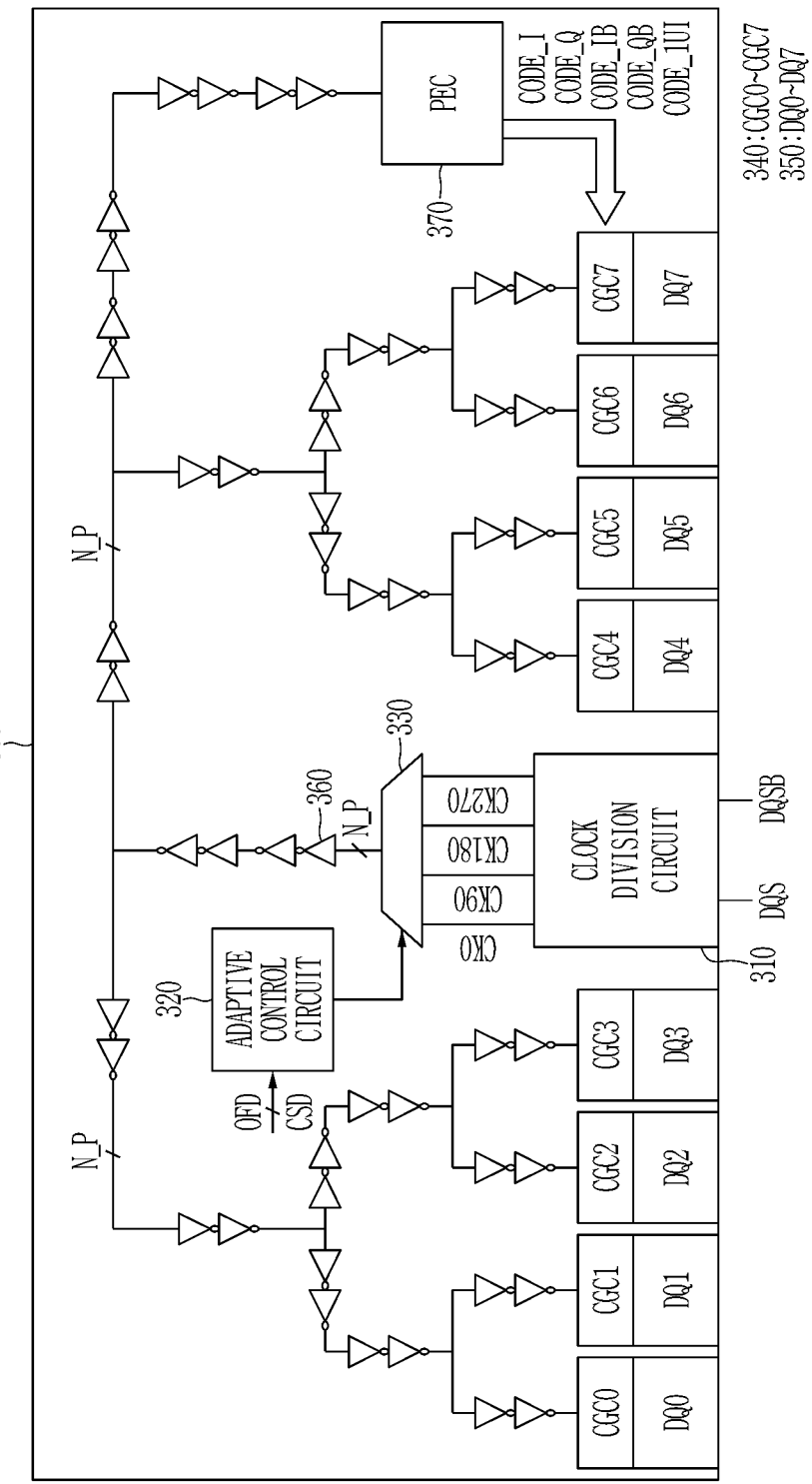
FIG. 3 is a schematic diagram showing a portion of a memory interface of a semiconductor memory device according to an example embodiment.

FIG. 3 schematically illustrates a portion of a memory interface of a semiconductor memory device according to an example embodiment.

As shown in FIG. 3, a memory interface 300 may comprise a clock division circuit 310, an adaptive control circuit 320, a clock selection circuit 330, a plurality of clock generation circuits 340, a plurality of DQ driving circuits 350, a plurality of inverters 360, and a phase error correction circuit 370. In FIG. 3, each of the plurality of clock generation circuits 340 may be provided to correspond to each of the plurality of DQ driving circuits 350.

The clock divider circuit 310 may receive the data strobe signals DQS and DQSB, may generate two phase clock signals CK0 and CK180 by dividing the data strobe signal DQS by two, and may generate two phase clock signals CK90 and CK270 by dividing the data strobe signal DQSB by two. The data strobe signal DQS and the data strobe signal DQSB may have inverted phases, and the four phase clock signals CK0, CK90, CK180, and CK270 may sequentially have a phase difference of 90 degrees (=1 UI). In an implementation, the phase clock signal CK0 may have a phase (I) of 0 degrees, the phase clock signal CK90 may have a phase (Q) difference of 90 degrees with respect to the phase clock signal CK0, the phase clock signal CK180 may have a phase (IB) of 180 degrees with respect to the phase clock signal CK0, and the phase clock signal CK270 may have a phase (QB) of 270 degrees with respect to the phase clock signal CK0.

The adaptive control circuit 320 may transmit one, two, or four of the four phase clock signals based on the operating frequency information OFD or the channel state information CSD. That is, "N_P" shown in FIG. 3 may be one, two, or four.

The adaptive control circuit 320 may transmit one phase clock signal CK0, two phase clock signals CK0 and CK90, or four phase clock signals CK0, CK90, CK180, and CK270 to the plurality of DQ driving circuits 350 according to the selected transmission. In an implementation, when the operating frequency according to the operating frequency information OFD is smaller than or equal to a first reference value, the adaptive control circuit 320 may instruct the clock selection circuit 330 to transmit all of the four phase clock signals CK0, CK90, CK180, and CK270 to the plurality of DQ driving circuits 350. When the operating frequency exceeds the first reference value and is smaller than or equal to a second reference value, the adaptive control circuit 320 may instruct the clock selection circuit 330 to select two phase clock signals CK0 and CK90 to transmit them to the plurality of DQ driving circuits 350. When the operating frequency exceeds the second reference value, the adaptive control circuit 320 may instruct the clock selection circuit 330 to transmit one phase clock signal CK0 to the plurality of DQ driving circuits 350.

Four channels corresponding to each of the plurality of phase clock signals CK0, CK90, CK180, and CK270 may be formed between the clock division circuit 310, the clock selection circuit 330, and the plurality of DQ driving circuits 350. The plurality of inverters 360 that may buffer and transmit each phase clock signal from the clock selection circuit 330 to the plurality of DQ driving circuits 350 may be connected to each of the four channels. As the operating frequency increases, an amount of power consumption may increase. As the number of channels in which the phase clock signal is buffered and transmitted among the four channels between the clock division circuit 310 and the plurality of DQ driving circuits 350 increases, power consumption may increase. Accordingly, in order to reduce power consumption, the adaptive control circuit 320 may determine the number of phase clock signals to be transmitted to the plurality of DQ driving circuits 350 among the four phase clock signals CK0 to CK270 according to the operating frequency.

In addition, when an eye width of an eye diagram of a channel indicated by the channel state information CSD together with the operating frequency is smaller than a predetermined reference value, the adaptive control circuit 320 may control the clock selection circuit 330 to transmit a smaller number of phase clock signals among the four phase clock signals CK0, CK90, CK180, and CK270 to the plurality of DQ driving circuits 350. When the eye width is smaller than the reference value, phase error correction (PEC) should be performed to improve the channel condition, and when all of the four phase clock signals CK0, CK90, CK180, and CK270 having four phases are transmitted to the plurality of DQ driving circuits 350, since the PEC does not need to be performed, the eye width cannot be improved. When the number of phases of the clock signal transmitted to the plurality of DQ driving circuits 350 is two or one, PEC for accurate restoration of the phase clock signal may be performed. Therefore, when the channel condition is below a predetermined level, the adaptive control circuit 320 may induce the channel state improvement through the PEC by transmitting only some of the four phase clock signals CK0, CK90, CK180, and CK270, e.g., two phase clock signals CK0 and CK90 or only one phase clock signal CK0, to the plurality of DQ driving circuits 350.

The phase error correction circuit 370 may receive the phase clock signal provided from the clock selection circuit 330, may generate the four clock signals CLK0, CLK90, CLK180, and CLK270 by using the received phase clock signal, and may generate a correction code according to a phase difference between two clock signals having a 1 UI phase difference among the generated four clock signals CLK0, CLK90, CLK180, and CLK270.

In an implementation, the phase error correction circuit 370 may shift an output (hereinafter, a first output) based on the clock signal CLK0 having a phase of 0 degrees among the four clock signals CLK0, CLK90, CLK180, and CLK270 by 1 UI, and may generate a phase correction code CODE_Q according to a phase difference between an output (hereinafter, a second output) based on the clock signal CLK90 having a phase of 90 degrees and the first output. The clock generation circuit 340 may adjust the phase of the clock signal CK90 according to the phase correction code CODE_Q.

The phase error correction circuit 370 may shift the second output by 1 UI, and may generate a phase correction code CODE_IB according to a phase difference between an output (hereinafter, a third output) based on the clock signal CLK180 having a phase of 180 degrees and the second output. The clock generation circuit 340 may adjust a duty cycle of the clock signal CK0 according to the phase correction code CODE M.

The phase error correction circuit 370 may shift the third output by 1 UI, and may generate a phase correction code CODE_QB according to a phase difference between an output (hereinafter, a fourth output) based on the clock signal CLK270 having a phase of 270 degrees and the third output. The clock generation circuit 340 may adjust a duty cycle of the clock signal CK90 according to the phase correction code CODE_QB.

The phase error correction circuit 370 may shift the fourth output by 1 UI, and may generate a phase correction code CODE_Q according to a phase difference between the first output and the fourth output. The clock generation circuit 340 may adjust the phase of the clock signal CK90 according to the phase correction code CODE_Q.

The phase error correction circuit 370 may also generate a code CODE_1UI (hereinafter, a unit delay code) indicating a phase delay corresponding to 1 UI. This will be described with reference to FIG. 17 and FIG. 18.

Each of the plurality of clock generation circuits 340 may restore one phase clock signal CK0 or two phase clock signals CK0 and CK90 provided from the clock selection circuit 330 to generate four clock signals CLK0, CLK90, CLK180, and CLK270 to supply them to the plurality of DQ driving circuits 350. Each of the plurality of clock generation circuits 340 may control the phase and duty cycle of the four clock signals CLK0, CLK90, CLK180, and CLK270 according to the plurality of correction codes CODE_I, CODE_Q, CODE_IB, and CODE_QB and the unit delay code CODE_1UI provided from the phase error correction circuit 370. When the plurality of clock generation circuits 340 receives the four phase clock signals CK0, CK90, CK180, and CK270, they may supply the four phase clock signals CK0, CK90, CK180, and CK270 to the plurality of DQ driving circuit 350 as they are. A description of the plurality of clock generation circuits 340 will be described later.

Each of the plurality of DQ driving circuits 350 may include a data output circuit and a data input circuit. The data output circuit may generate the data signal DATA by converting data read from the memory cell array 210 according to the plurality of clock signals CLK0, CLK90, CLK180, and CLK270. The data input circuit may generate data to be written into the memory cell array 210 by sampling the data signal DATA according to the plurality of clock signals CLK0, CLK90, CLK180, and CLK270. The data output circuit and the data input circuit of each of the plurality of DQ driving circuits 350 may have the same configuration.

Figure 4:
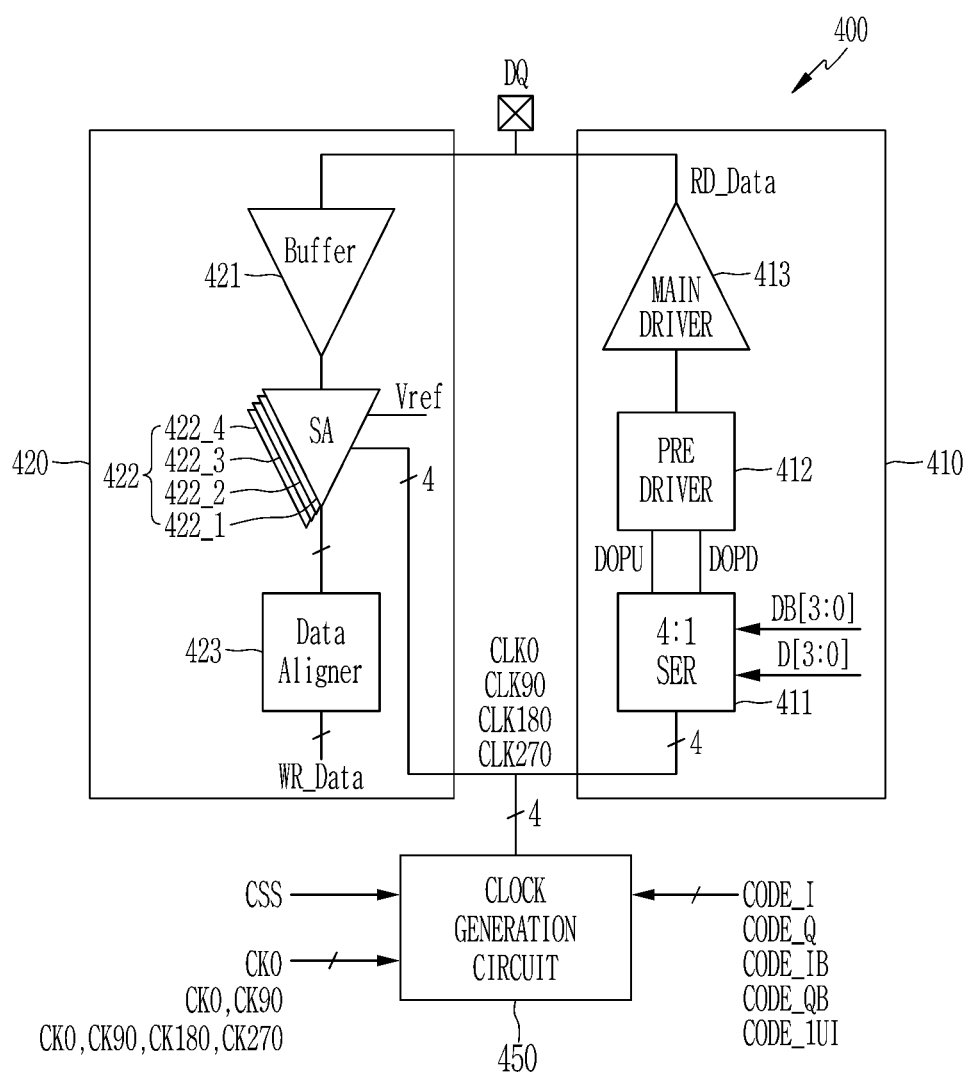
FIG. 4 is a schematic diagram showing one of a plurality of DQ driving circuits according to an example embodiment.

FIG. 4 schematically illustrates one of a plurality of DQ driving circuits according to an example embodiment.

As shown in FIG. 4, a driving circuit 400 may comprise a data output circuit 410 and a data input circuit 420. A clock generation circuit 450 may restore one phase clock signal CK0 or two phase clock signals CK0 and CK90 provided from the clock selection circuit 330 to generate four clock signals CLK0, CLK90, CLK180, and CLK270 to supply them to the driving circuit 400.

First, a configuration of the clock generation circuit 450 will be described. The clock generation circuit 450 may receive information about the number of selected phase clock signals among the four phase clock signals CK0, CK90, CK180, and CK270 from the adaptive control circuit 320. In an implementation, the adaptive control circuit 320 may provide the number of selected phase clock signals among the four phase clock signals CK0, CK90, CK180, and CK270, that is, a clock selection signal CSS may indicate one phase clock signal CK0, two phase clock signals CK0 and CK90, or four phase clock signals CK0, CK90, CK180, and CK270, to the clock generation circuit 450. The adaptive control circuit 320 may also provide the clock selection signal CSS to the clock selection circuit 330. The clock generation circuit 450 may receive one phase clock signal CK0, two phase clock signals CK0 and CK90, or four phase clock signals CK0, CK90, CK180, and CK270 from the clock selection circuit 330

The clock generation circuit 450 may receive the plurality of correction codes CODE_I, CODE_Q, CODE_IB, and CODE_QB and the unit delay code CODE_1UI from the phase error correction circuit 370.

The clock generation circuit 450 may generate the four clock signals CLK0, CLK90, CLK180, and CLK270 by using the clock selection signal CSS, the phase clock signals of numbers corresponding to the clock selection signal CSS, the plurality of correction codes CODE_I, CODE_Q, CODE_IB, and CODE_QB, and the unit delay code CODE_1UI.

Figure 5:
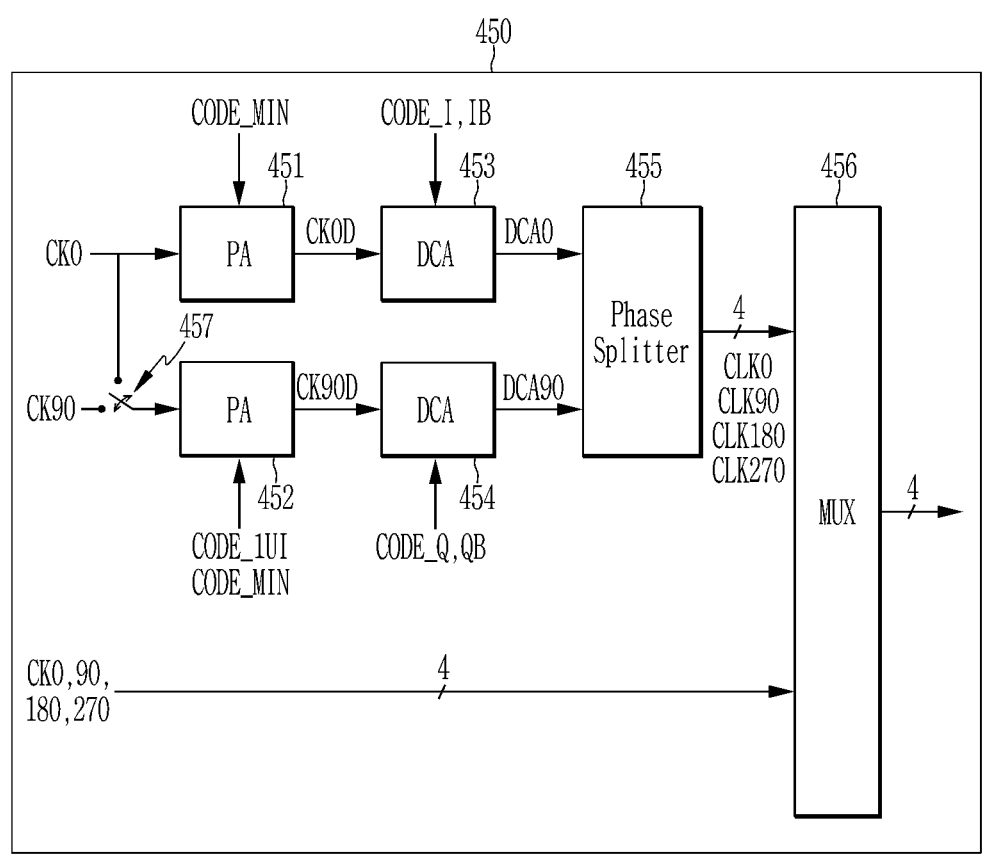
FIG. 5 is a configuration of a clock generation circuit according to an example embodiment.

FIG. 5 illustrates a configuration of a clock generation circuit according to an example embodiment.

The clock generation circuit 450 may include phase adjusters 451 and 452, duty cycle adjusters 453 and 454, a phase splitter 455, and a multiplexer 456. The clock generation circuit 450 may further include a multi-switch 457.

When the clock selection signal CSS instructs transmission of one phase clock signal, the clock generation circuit 450 may control the multi-switch 457 so that the clock signal CK0 may be provided to the phase adjuster 452. In an implementation, when the multi-switch 457 is connected to a channel connected to an input terminal of the phase adjuster 451, the phase clock signal CK0 may be provided to the phase adjuster 452. When the clock selection signal CSS instructs transmission of two phase clock signals, the clock generation circuit 450 may control the multi-switch 457 so that the clock signal CK90 is provided to the phase adjuster 452. In an implementation, a channel provided with the clock signal CK90 and the phase adjuster 452 may be connected. The clock generation circuit 450 may control the multi-switch 457 to a neutral state when the clock selection signal CSS instructs transmission of four phase clock signals.

The phase adjuster 451 may generate a clock signal CK0D by delaying the phase of the phase clock signal CK0 by a phase indicated by a minimum delay code CODE_MIN. The minimum delay code CODE_MIN may be provided from the phase error correction circuit 370.

The duty cycle adjuster 453 may generate a clock signal DCA0 by adjusting the phase and duty cycle of the clock signal CK0D according to the correction codes CODE_I and CODE_IB. In an implementation, the duty cycle adjuster 453 may delay the phase of the clock signal CK0D according to the correction code CODE_I or may adjust the on-duty of the clock signal CK0D according to the correction code CODE_IB to adjust the clock signal DCA0.

When the phase adjuster 452 receives the phase clock signal CK0, it may delay the phase of the phase clock signal CK0 by a phase MIN indicated by the minimum delay code CODE_MIN and by 1 UI indicated by the unit delay code CODE_1UI to generate a clock signal CK90D. Alternatively, when receiving the phase clock signal CK90, the phase adjuster 452 may delay the phase of the phase clock signal CK90 by the phase MIN indicated by the minimum delay code CODE_MIN to generate the clock signal CK90D. The phase adjuster 452 may selectively determine a phase delay amount (MIN or 1UI+MIN) according to the clock selection signal CSS, and may generate the clock signal CK90D from the clock signal CK0 or the clock signal CK90D from the clock signal CK90.

The duty cycle adjuster 454 may generate a clock signal DCA90 by adjusting the phase and duty cycle of the clock signal CK90D according to the correction codes CODE_Q and CODE_QB. In an implementation, the duty cycle adjuster 454 may delay the phase of the clock signal CK90D according to the correction code CODE_Q or may adjust the on-duty cycle of the clock signal CK90D according to the correction code CODE_QB to adjust the clock signal DCA90.

The phase splitter 455 may generate the four clock signals CLK0, CLK90, CLK180, and CLK270 by splitting the respective phases of the two clock signals DCA0 and DCA90 into two phases. In an implementation, the phase splitter 455 may generate two clock signals CLK0 and CLK90 by buffering the two clock signals DCA0 and DCA90, and may generate two clock signals CLK180 and CLK270 by inverting the two clock signals DCA0 and DCA90, respectively.

The multiplexer 456 may provide the four clock signals CLK0, CLK90, CLK180, and CLK270 outputted from the phase splitter 455 or the four phase clock signals CK0, CK90, CK180, and CK270 provided from the clock selection circuit 330 according to the clock selection signal CSS to the data output circuit 410 and the data input circuit 420. In an implementation, the multiplexer 456 may output the four clock signals CLK0, CLK90, CLK180, and CLK270 outputted from the phase splitter 455 when the clock selection signal CSS instructs transmission of one or two phase clock signals, and it may output the four clock signals CK0, CK90, CK180, and CK270 provided from the clock selection circuit 330 when the clock selection signal CSS instructs transmission of the four phase clock signals. That is, when all of the four clock signals CK0, CK90, CK180, and CK270 are provided to the clock generation circuit 450, the multiplexer 456 may provide the four clock signals CK0, CK90, CK180, and CK270 as they are to the data output circuit 410 and the data input circuit 420.

Referring back to FIG. 4, the data input circuit 420 may be synchronized with the four clock signals CLK0, CLK90, CLK180, and CLK270 to sample a data signal provided through a DQ terminal to generate write data WR_Data. The data input circuit 420 may include a buffer 421, a plurality of sampling amplifier (SA) 422, and a data aligner 423. The plurality of sampling amplifiers 422 may include a sampling amplifier 422_1, a sampling amplifier 422_2, a sampling amplifier 423_3, and a sampling amplifier 422_4.

The buffer 421 may provide the data signal received through the DQ terminal to the plurality of sampling amplifiers 422. Each of the plurality of sampling amplifiers 422 may compare a reference voltage Vref and the corresponding data signals in synchronization with an edge of the corresponding clock signal among the four clock signals CLK0, CLK90, CLK180, and CLK270, and may generate an output according to the compared result to provide it to the data aligner 423. The data aligner 423 may generate write data WR_Data by synchronizing the outputs of the plurality of sampling amplifiers 422 having four phases according to one of the four phases.

Figure 6:
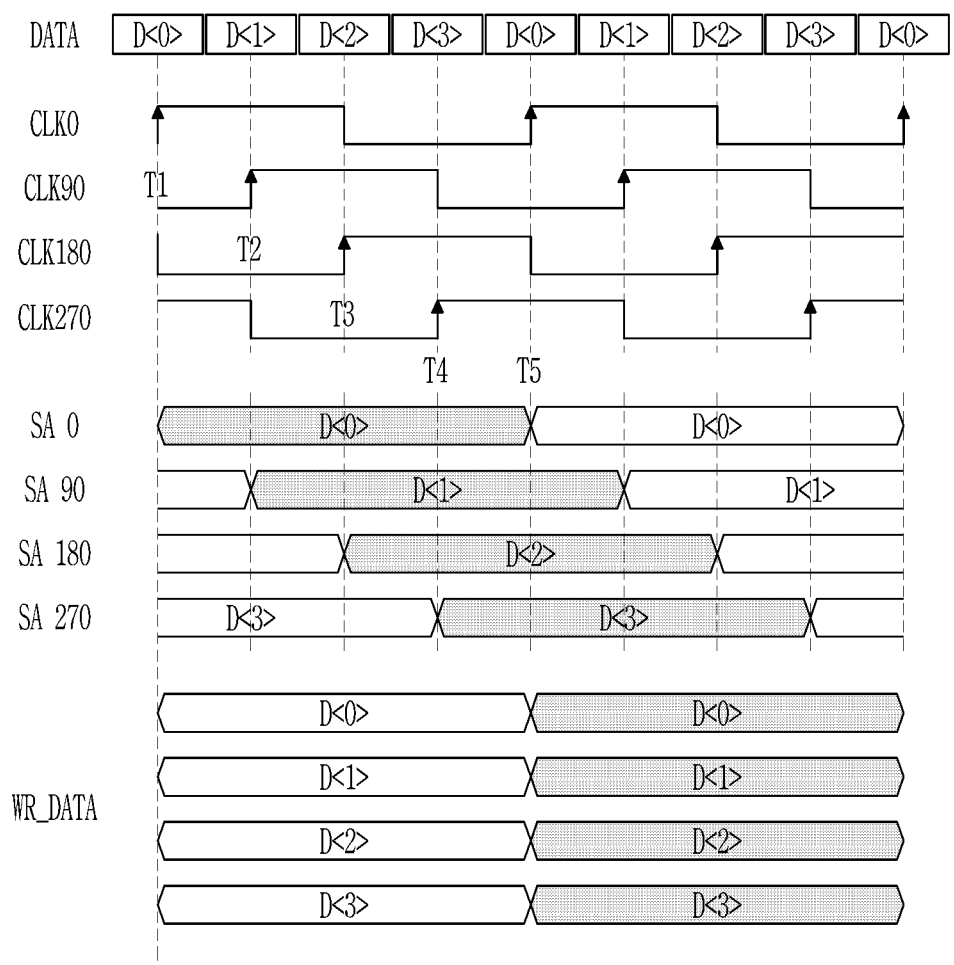
FIG. 6 shows waveform diagrams of a data signal, four clock signals, outputs of a plurality of sampling amplifiers, and write data according to an example embodiment.

FIG. 6 illustrates waveform diagrams of a data signal, four clock signals, outputs of a plurality of sampling amplifiers, and write data according to an embodiment.

In the clock multiplexer 414_4, unlike the clock multiplexer 414_1, the clock signal CLK0 may be input to the gate of the NMOS transistor, the clock signal (CLK180) may be input to the gate of the PMOS transistor, the clock signal (CLK270) may be input to the transmission gate TG1, and the clock signal CLK90 may be input to the transmission gate TG2. At a time point T2, the sampling amplifier 422_2 may output a result D<1> that may sample and amplify data D<1> among the data signals in synchronization with a rising edge of the clock signal CLK90. At a time point T3, the sampling amplifier 422_3 may output a result D<2> that may sample and amplify data D<2> among the data signals in synchronization with a rising edge of the clock signal CLK180. At a time point T4, the sampling amplifier 422_4 may output a result D<3> that may sample and amplify data D<3> among the data signals received through the DQ terminal in synchronization with a rising edge of the clock signal CLK270. The data aligner 423 may generate the write data WR_Data by synchronizing the outputs D<0>, D<1>, D<2>, and D<3> of the plurality of sampling amplifiers 422 to the rising edge of clock signal CK0.

In FIG. 4, the data output circuit 410 may convert data (D[3:0]) and inverted data (DB[3:0]) by using the four clock signals CLK0, CLK90, CLK180, and CLK270 to generate a data up signal DOPU and a data down signal DOPD, and may generate read data RD_Data according to the up data DOPU and the down data DOPD.

The data output circuit 410 may include a serializer 411, a pre-driver 412, and a main driver 413.

The serializer 411 may multiplex the four clock signals CLK0, CLK90, CLK180, and CLK270 according to the four combinations of the four clock signals CLK0, CLK90, CLK180, and CLK270 to generate four delayed clock signal pairs configured of two signals having inverted phases. The serializer 411 may generate the up data DOPU by serializing corresponding data bits among the data (D[3:0]) according to each of the four delayed clock signal pairs, and may generate the up data DOPD by serializing corresponding data bits among the inverted data (DB[3:0]) according to each of the four delayed clock signal pairs.

Figure 7:
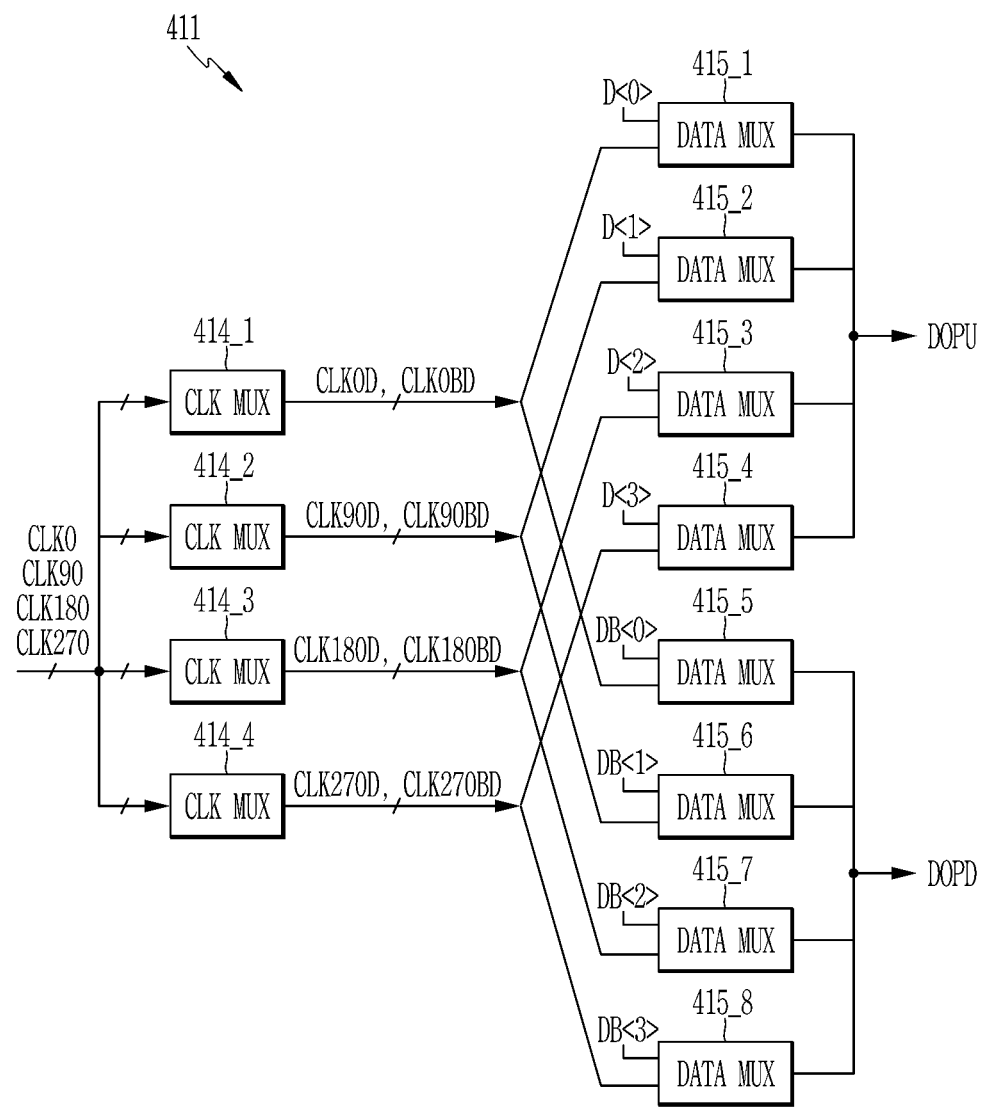
FIG. 7 is a circuit diagram of a serializer according to an example embodiment.

FIG. 7 illustrates a circuit diagram of a serializer according to an example embodiment.

As shown in FIG. 7, the serializer 411 may comprise four clock multiplexers 414_1 to 414_4 and eight data multiplexers 415_1 to 415_8.

The clock multiplexer 414_1 may multiplex the four clock signals CLK0, CLK90, CLK180, and CLK270 to generate a delayed clock signal pair (CLK0D, CLK0BD). The clock multiplexer 414_2 may multiplex the four clock signals CLK0, CLK90, CLK180, and CLK270 to generate a delayed clock signal pair (CLK90D, CLK90BD). The clock multiplexer 414_3 may multiplex the four clock signals CLK0, CLK90, CLK180, and CLK270 to generate a delayed clock signal pair (CLK180D, CLK180BD). The clock multiplexer 414_4 may multiplex the four clock signals CLK0, CLK90, CLK180, and CLK270 to generate a delayed clock signal pair (CLK270D, CLK270BD).

The data multiplexer 415_1 may generate an output corresponding to D<0> among the data D[3:0] according to the delayed clock signal pair (CLK0D, CLK0BD). The data multiplexer 415_2 may generate an output corresponding to D<1> among the data D[3:0] according to the delayed clock signal pair (CLK90D, CLK90BD). The data multiplexer 415_3 may generate an output corresponding to D<2> among the data D[3:0] according to the delayed clock signal pair (CLK180D, CLK180BD). The data multiplexer 415_4 may generate an output corresponding to D<3> among the data D[3:0] according to the delayed clock signal pair (CLK270D, CLK270BD). The outputs of the data multiplexers 415_1 to 415_4 may be combined to provide the up data DOPU.

The data multiplexer 415_5 may generate an output corresponding to DB<0> among the inverted data DB[3:0] according to the delayed clock signal pair (CLK0D, CLK0BD). The data multiplexer 415_6 may generate an output corresponding to BD<1> among the inverted data DB[3:0] according to the delayed clock signal pair (CLK90D, CLK90BD). The data multiplexer 415_7 may generate an output corresponding to DB<2> among the data DB[3:0] according to the delayed clock signal pair (CLK180D, CLK180BD). The data multiplexer 415_8 may generate an output corresponding to DB<3> among the inverted data DB[3:0] according to the delayed clock signal pair (CLK270D, CLK270BD). The outputs of the data multiplexers 415_5 to 415_8 may be combined to provide the down data DOPD.

Figure 8:
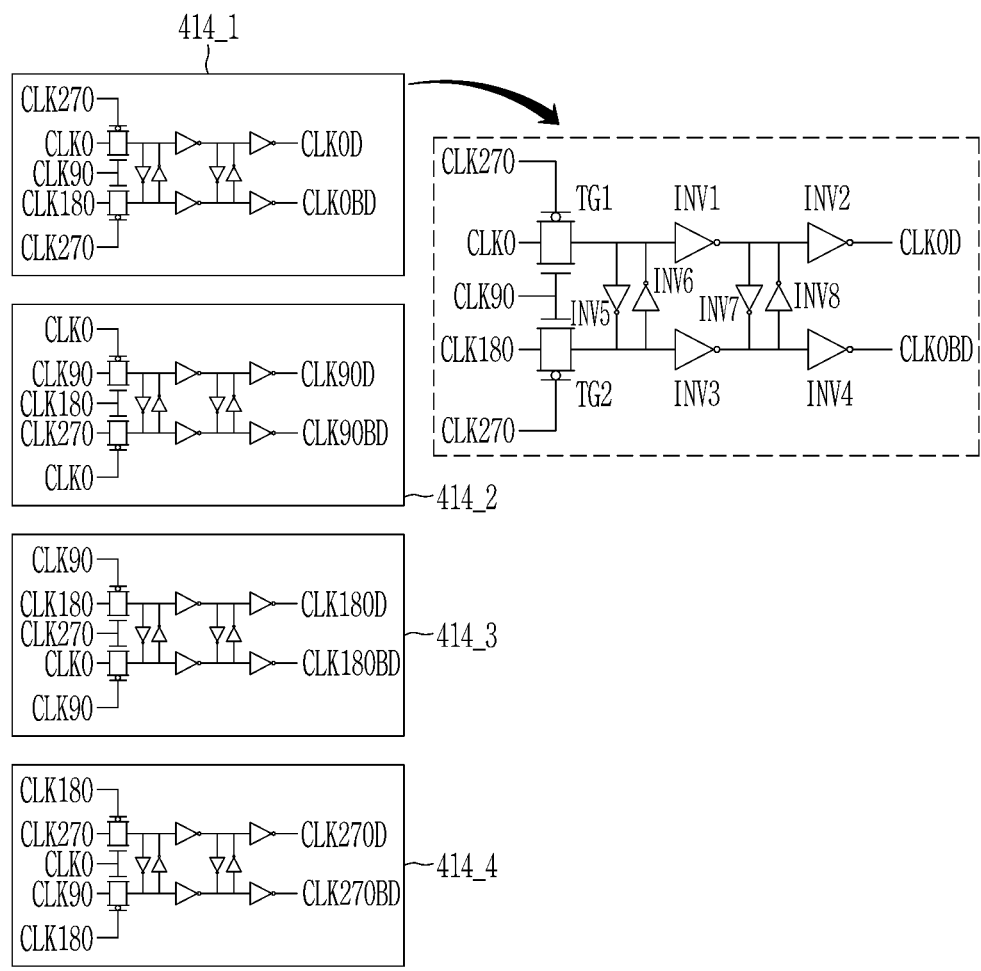
FIG. 8 shows circuit diagrams of four clock multiplexers according to an example embodiment.

FIG. 8 illustrates circuit diagrams of four clock multiplexers according to an example embodiment.

As shown in FIG. 8, the circuits of the four clock multiplexers 414_1 to 414_4 may be the same, and methods in which the four clock signals CLK0, CLK90, CLK180, and CLK270 are provided to the circuits may be different. Accordingly, only a configuration of one 414_1 of the four clock multiplexers 414_1 to 414_4 will be described.

The clock multiplexer 414_1 may include two transmission gates TG1 and TG2, and eight inverters INV1 to INV8. When the clock signal CLK270 is inputted to a gate of a PMOS transistor of each of the transmission gate TG1 and the transmission gate TG2, and when the clock signal CLK90 is inputted to a gate of an NMOS transistor of each of the transmission gate TG1 and the transmission gate TG2, the clock signal CLK0 may be inputted to an input terminal of the transmission gate TG1, and the clock signal CLK180 may be inputted to an input terminal of the transmission gate TG2. The output of the transmission gate TG1 and the output of the transmission gate TG2 may be respectively transmitted to the inverter INV1 and the inverter INV3 through a latch implemented with two inverters INV5 and INV6, and each of the inverters INV1 and INV3 may generate an output obtained by inverting an input. The output of each of the two inverters INV1 and INV3 may be inputted to each of the inverters INV2 and INV4 through the latch implemented with the inverters INV5 and INV6, and each of the inverters INV2 and INV4 may invert an input to output the delayed clock signal CLK0D and the delayed clock signal CLK0BD having an inverted phase of the clock signal CLK0D.

As shown in FIG. 8, each of the remaining clock multiplexers 414_2 to 414_4 may be implemented with the same configuration as the clock multiplexer 414_1. However, in the clock multiplexer 414_2, unlike the clock multiplexer 414_1, the clock signal CLK0 may be inputted to the gate of the PMOS transistor, the clock signal CLK180 may be inputted to the gate of the NMOS transistor, the clock signal CLK90 may be inputted to the transmission gate TG1, and the clock signal CLK270 may be inputted to the transmission gate TG2. In the clock multiplexer 414_3, unlike the clock multiplexer 414_1, the clock signal CLK270 may be inputted to the gate of the NMOS transistor, the clock signal CLK90 may be inputted to the gate of the PMOS transistor, the clock signal CLK180 may be inputted to the transmission gate TG1, and the clock signal CLK270 may be inputted to the transmission gate TG2. In the clock multiplexer 414_4, unlike the clock multiplexer 414_1, the clock signal CLK0 may be inputted to the gate of the NMOS transistor, the clock signal CLK180 may be inputted to the gate of the PMOS transistor, the clock signal CLK270 may be inputted to the transmission gate TG1, and the clock signal CLK90 may be inputted to the transmission gate TG2.

Figure 9:
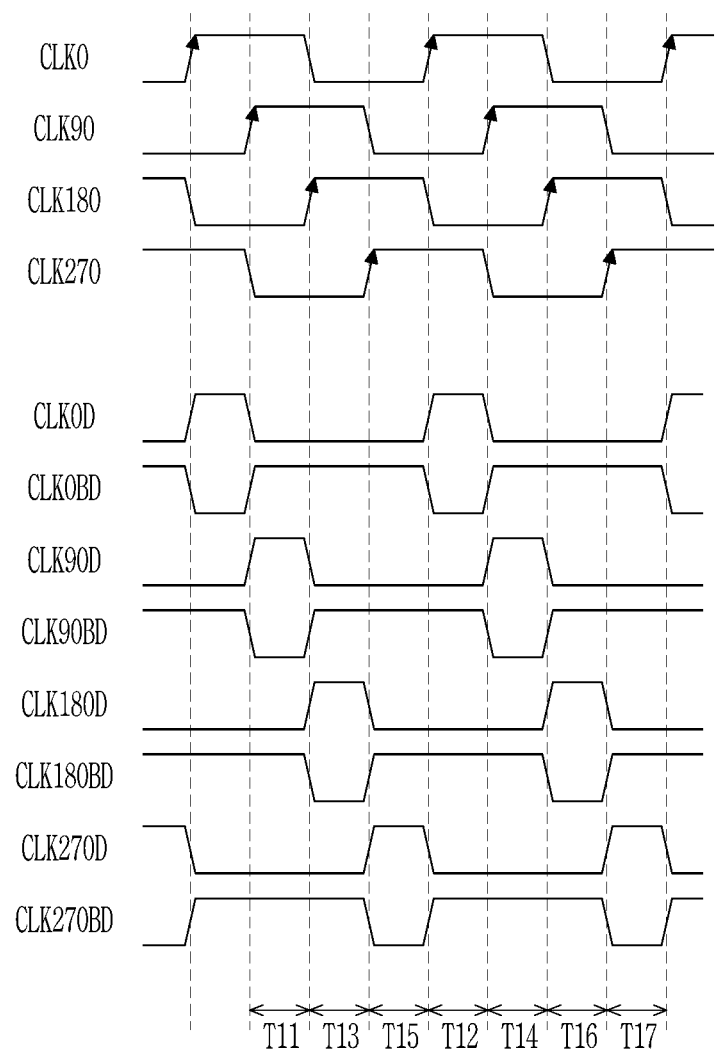
FIG. 9 shows waveform diagrams of four clock signals and four delayed clock signal pairs according to an example embodiment.

FIG. 9 illustrates waveform diagrams of four clock signals and four delayed clock signal pairs according to an example embodiment.

In a period T11, when the clock signal CLK270 is at a low level and the clock signal CLK90 is at a high level, the clock signal CLK0 and the clock signal CLK180 may be transmitted through two transmission gates TG1 and TG2, and the outputs of the two transmission gates TG1 and TG2 may be respectively latched by the inverter INV5 and INV6. The outputs of two latched transmission gates TG1 and TG2 may be respectively inverted and outputted by two inverters INV1 and INV3. The respective outputs of the two inverters INV1 and INV3 may be latched by the inverters INV5 and INV6. The respective outputs of the two inverters INV1 and INV3 latched in a period T12 may be inverted by the two inverters INV2 and INV4 and may be outputted as the delayed clock signal CLK0D and the delayed clock signal CLK0BD.

In a period T13, when the clock signal CLK0 is at a low level and the clock signal CLK180 is at a high level, the clock signal CLK90 and the clock signal CLK270 may be transmitted through two transmission gates TG1 and TG2, and the outputs of the two transmission gates TG1 and TG2 may be respectively latched by the inverter INV5 and INV6. The respective outputs of two latched transmission gates TG1 and TG2 may be inverted and outputted by the two inverters INV1 and INV3. The respective outputs of the two inverters INV1 and INV3 may be latched by the inverters INV5 and INV6. The respective outputs of the two inverters INV1 and INV3 latched in a period T14 may be inverted by the two inverters INV2 and INV4 and outputted as the delayed clock signal CLK90D and the delayed clock signal CLK90BD.

In a period T15, when the clock signal CLK90 is at a low level and the clock signal CLK270 is at a high level, the clock signal CLK180 and the clock signal CLK0 may be transmitted through two transmission gates TG1 and TG2, and the respective outputs of the two transmission gates TG1 and TG2 may be latched by the inverter INV5 and INV6. The respective outputs of two latched transmission gates TG1 and TG2 may be inverted and outputted by the two inverters INV1 and INV3. The respective outputs of the two inverters INV1 and INV3 may be latched by the inverters INV5 and INV6. The respective outputs of the two inverters INV1 and INV3 latched in a period T16 may be inverted by the two inverters INV2 and INV4 and outputted as the delayed clock signal CLK180D and the delayed clock signal CLK180BD.

In a period T11, when the clock signal CLK180 is at a low level and the clock signal CLK0 is at a high level, the clock signal CLK270 and the clock signal CLK90 may be transmitted through two transmission gates TG1 and TG2, and the respective outputs of the two transmission gates TG1 and TG2 may be latched by the inverters INV5 and INV6. The respective outputs of two latched transmission gates TG1 and TG2 may be inverted and outputted by the two inverters INV1 and INV3. The respective outputs of the two inverters INV1 and INV3 may be latched by the inverters INV5 and INV6. The respective outputs of the two inverters INV1 and INV3 latched in a period T17 may be inverted by the two inverters INV2 and INV4 and outputted as the delayed clock signal CLK270D and the delayed clock signal CLK270BD.

Figure 10:
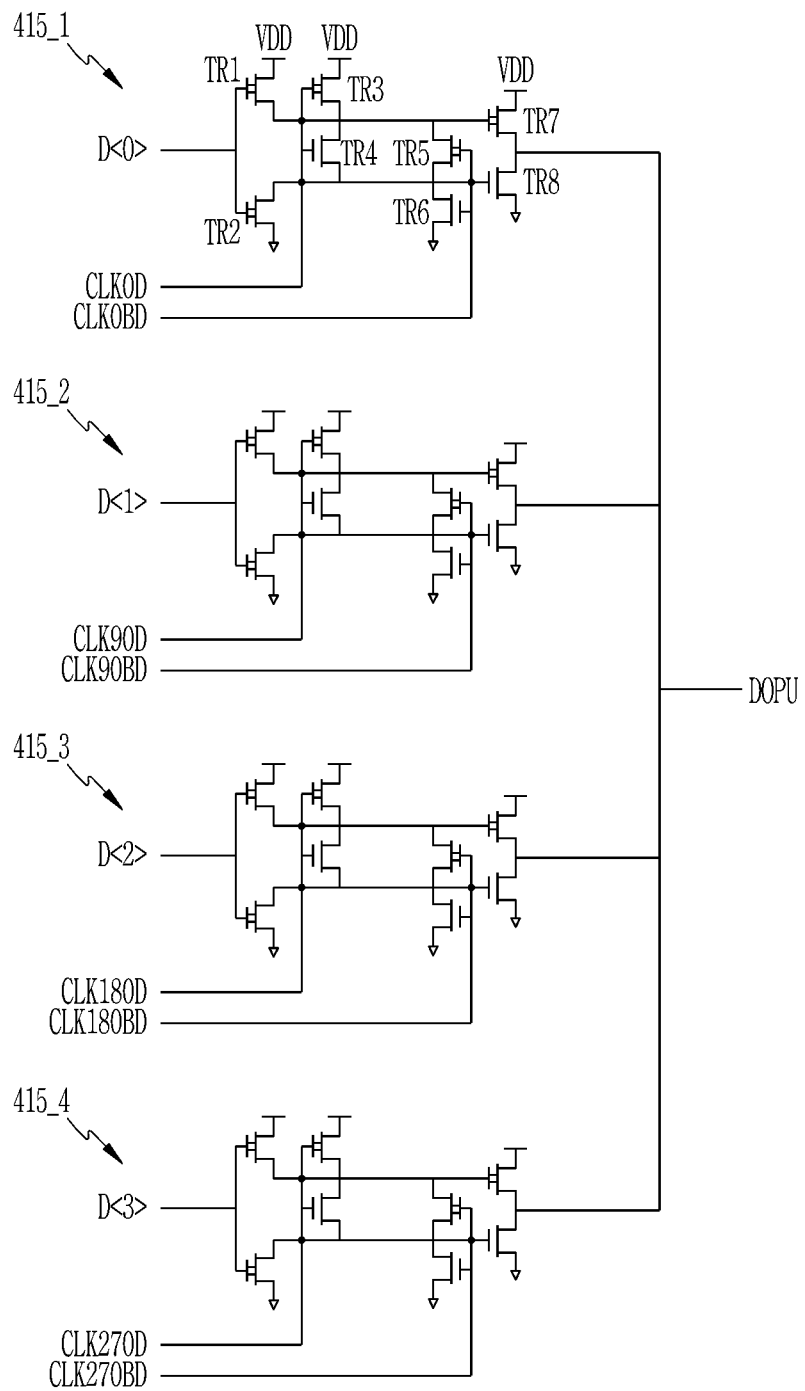
FIG. 10 is a circuit diagram of four data multiplexers receiving data according to an example embodiment.

FIG. 10 illustrates a circuit diagram of four data multiplexers receiving data according to an example embodiment.

The four data multiplexers 415_1 to 415_4 generating the up data DOPU among the plurality of data multiplexers 415_1 to 415_8 are illustrated in FIG. 10. The four data multiplexers 415_1 to 415_4 may be implemented with the same circuit. However, data bits and clock signal pairs respectively corresponding to the four data multiplexers 415_1 to 415_4 may be different.

Each of the four data multiplexers 415_1 to 415_4 may generate the up data DOPU by serializing corresponding data bits D<0>, D<1>, D<2>, and D<3> among the data (D[3:0]) according to each of the clock signal pair (CLK0D, CLK0BD), the clock signal pair (CLK90D, CLK90BD), the clock signal pair (CLK180D, CLK180BD), and the clock signal pair (CLK270D, CLK270BD). Each of the four data multiplexers 415_5 to 415_8 may generate the down data DOPD by serializing corresponding data bits DB<0>, DB<1>, DB<2>, and DB<3> among the inverted data (DB[3:0]) according to each of the clock signal pair (CLK0D, CLK0BD), the clock signal pair (CLK90D, CLK90BD), the clock signal pair (CLK180D, CLK180BD), and the clock signal pair (CLK270D, CLK270BD).

The data multiplexer 415_1 may comprise eight transistors TR1 to TR8. A data bit (D<0>) may be input to gates of the transistor TR1 and the transistor TR2, a voltage VDD and a ground voltage may be provided to respective sources of the transistor TR1 and the transistor TR2, and respective drains of the transistor TR1 and the transistor TR2 may be connected to respective gates of the transistor TR7 and the transistor TR8. The transistor TR3 and the transistor TR4 may be serially connected between the gate of the transistor TR8 and the voltage VDD, and the delayed clock signal CLK0D may be supplied to the gates of the transistor TR3 and the transistor TR4. The transistor TR5 and the transistor TR6 may be serially connected between the gate of the transistor TR7 and the ground voltage, and the delayed clock signal CLK0BD may be supplied to the gates of the transistor TR5 and the transistor TR6. Each of the transistors TR1 and TR2 may perform a switching operation according to the level of the data bit (D<0>), each of the transistors TR3 and TR4 may perform a switching operation according to the delayed clock signal CLK0D, and the transistors TR5 and TR6 may perform a switching operation according to the delayed clock signal CLK0BD.

When the data bit (D<0>) is at a high level of '1', the transistor TR2 may be turned on, and the ground voltage may be supplied to the gate of the transistor TR8, so that the transistor TR8 may be turned off. In this case, the transistor TR7 may be turned on by the ground voltage supplied through the transistor TR4 that is turned on by the high level of the delayed clock signal CLK0D. That is, when the data bit (D<0>) is at a high level of '1', the data multiplexer 415_1 may provide a high level output during a high level period of the delayed clock signal CLK0D.

When the data bit (D<0>) is at a low level of '0', the transistor TR1 may be turned on and the voltage VDD may be supplied to the gate of the transistor TR7, so that the transistor TR7 may be turned off In this case, the transistor TR8 may be turned on by the voltage VDD supplied through the transistor TR5 that is turned on by the low level of the delayed clock signal CLK0BD. That is, when the data bit (D<0>) is at a low level of '0', the data multiplexer 415_1 may provide a low level output during a low level period of the delayed clock signal CLK0BD.

In this way, each of the remaining data multiplexers 415_2 to 415_4 may also provide an output according to the logic level of the corresponding data bit. As can be seen from the waveform diagram of FIG. 9, since the delayed clock signal pair (CLK0D, CLK0BD), the delayed clock signal pair (CLK90D, CLK90BD), the delayed clock signal pair (CLK180D, CLK180BD), and the delayed clock signal pair (CLK270D, CLK270BD) sequentially have a phase difference of 1 UI and have a high level and a low level for 1 UI, and the outputs corresponding to the data bits D<0>, D<1>, D<2>, and D<3> may be sequentially serialized to form the up data DOPU.

Figure 11:
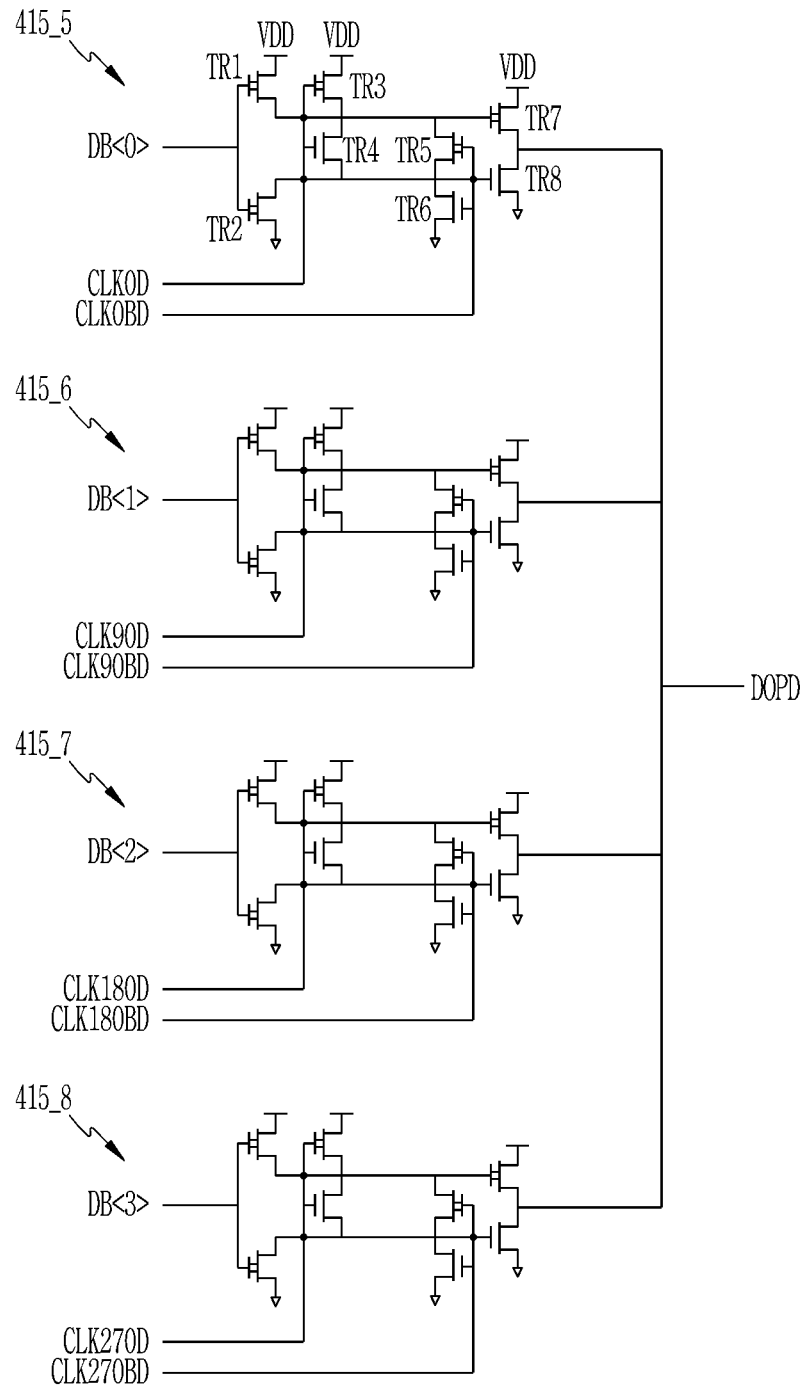
FIG. 11 is a circuit diagram of four data multiplexers receiving inverted data according to an example embodiment.

FIG. 11 illustrates a circuit diagram of four data multiplexers receiving inverted data according to an example embodiment.

As shown in FIG. 11, four data multiplexers 415_5 to 415_8 may be different from the four data multiplexers 415_1 to 415_4 shown in FIG. 10 in that data bits of inverted data (DB[3:0]) are inputted. That is, data bits DB<0>, DB<1>, DB<2>, and DB<3> of the inverted data (DB[3:0]) may be respectively inputted to the gates of the two transistors TR1 and TR2 of each of the four data multiplexers 415_5 to 415_8. The four data multiplexers 415_5 to 415_8 may configure the down data DOPD by generating outputs respectively corresponding to DB<0>, DB<1>, DB<2>, and DB<3> as in the four data multiplexers 415_1 to 415_4. Other configurations and operations thereof may be the same as those described with reference to FIG. 10, so a detailed description of FIG. 11 will be omitted.

The pre-driver 412 may operate according to the up data DOPU and the down data DOPS outputted from the serializer 411 to generate output, the main driver 413 may operate according to the output of the pre-driver 412 to generate the read data signal RD_Data, and they may be transmitted to the memory controller 120 through a channel connected to the DQ terminal.

A pull-up transistor and a pull-down transistor connected to the output terminal of the main driver 413 according to the embodiment may be implemented as transistors of the same channel type. Therefore, the up data DOPU and the down data DOPD may be provided to drive the main driver 413. That is, the serializer 411 according to the embodiment may generate two up data DOPU and the down data DOPD with the inverted data (DB[3:0]) together with the data (D[3:0]) to control the pull-up transistor and the pull-down transistor. When the pull-up transistor and the pull-down transistor have different channel types, the main driver 413 may be controlled only by the up data DOPU.

Referring back to FIG. 3, the phase error correction circuit 370 may provide the plurality of correction codes CODE_I, CODE_Q, CODE_IB, and CODE_QB and the unit delay code CODE_1UI to the clock generation circuit 340.

Figure 12:
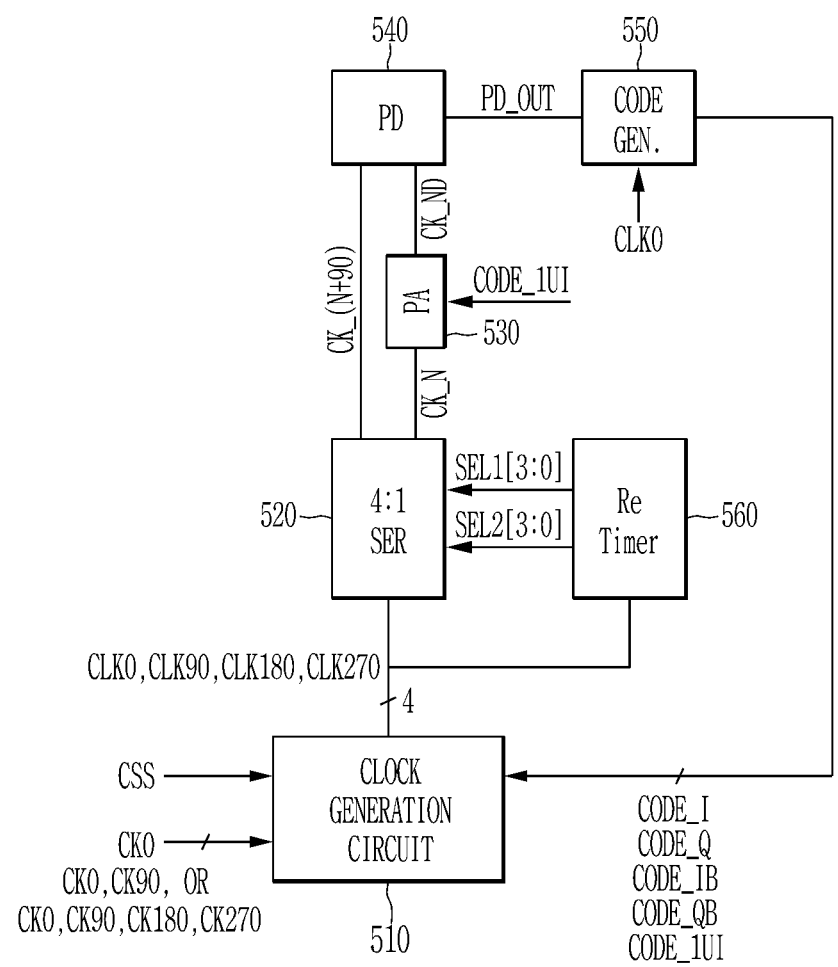
FIG. 12 is a schematic diagram of a phase error correction circuit according to an example embodiment.

FIG. 12 illustrates a schematic view of a phase error correction circuit according to an example embodiment.

In FIG. 12, a phase error correction circuit 500 may include a clock generation circuit 510, a serializer 520, a phase adjuster 530, a phase error detector 540, a code generator 550, and a re-timer 560. The clock generation circuit 510 shown in FIG. 11 may have the same configuration as the clock generation circuit 450 described with reference to FIG. 5.

The serializer 520 may multiplex the four clock signals CLK0, CLK90, CLK180, and CLK270 according to the four combinations of the four clock signals CLK0, CLK90, CLK180, and CLK270 to generate four delayed clock signal pairs, mask one of the four delayed clock signals according to a first selection signal (SEL1[3:0]) to output it as a first clock signal CK (N+90), and may mask one of the four delayed clock signals according to a second selection signal (SEL2[3:0]) to output it as a second clock signal CK_N. The four delayed clock signal pairs may comprise four delayed clock signals, and four delayed clock signals having inverted phases with respect to the four delayed clock signals. The first selection signal (SEL1[3:0]) may be a signal delayed for a predetermined period with respect to the second selection signal (SEL2[3:0]).

The serializer 520 may be implemented in the same structure as the serializer 411 of the data output circuit 410 described with reference to FIG. 7 to FIG. 10. However, the serializer 520 may input the first selection signal (SEL1[3:0]) instead of the data signal (D[3:0]) to the four data multiplexers to generate the first clock signal CK (N+90), and may input the second selection signal (SEL2[3:0]) to the four data multiplexers to generate the second clock signal CK_N.

The first selection signal (SEL1[3:0]) may comprise four phase selection signals SEL1_0, SEL1_90, SEL1_180, and SEL1_270 respectively corresponding to four phases of 0 degrees, 90 degrees, 180 degrees, and 270 degrees. The second selection signal (SEL2[3:0]) may comprise four phase selection signals SEL2_0, SEL2_90, SEL2_180, and SEL2_270 respectively corresponding to four phases of 0 degrees, 90 degrees, 180 degrees, and 270 degrees. A phase of a masking level phase selection signal of the first selection signal (SEL1[3:0]) may be 90 degrees later than a phase of a masking level phase selection signal of the second selection signal (SEL2[3:0]). The phase of the first clock signal CK (N+90) may have a phase delayed by 1 UI with respect to the second clock signal CK_N. When the phase selection signal is at the masking level, a masking operation may be performed on the first clock signal CK (N+90) and the second clock signal CK_N.

Figure 13:
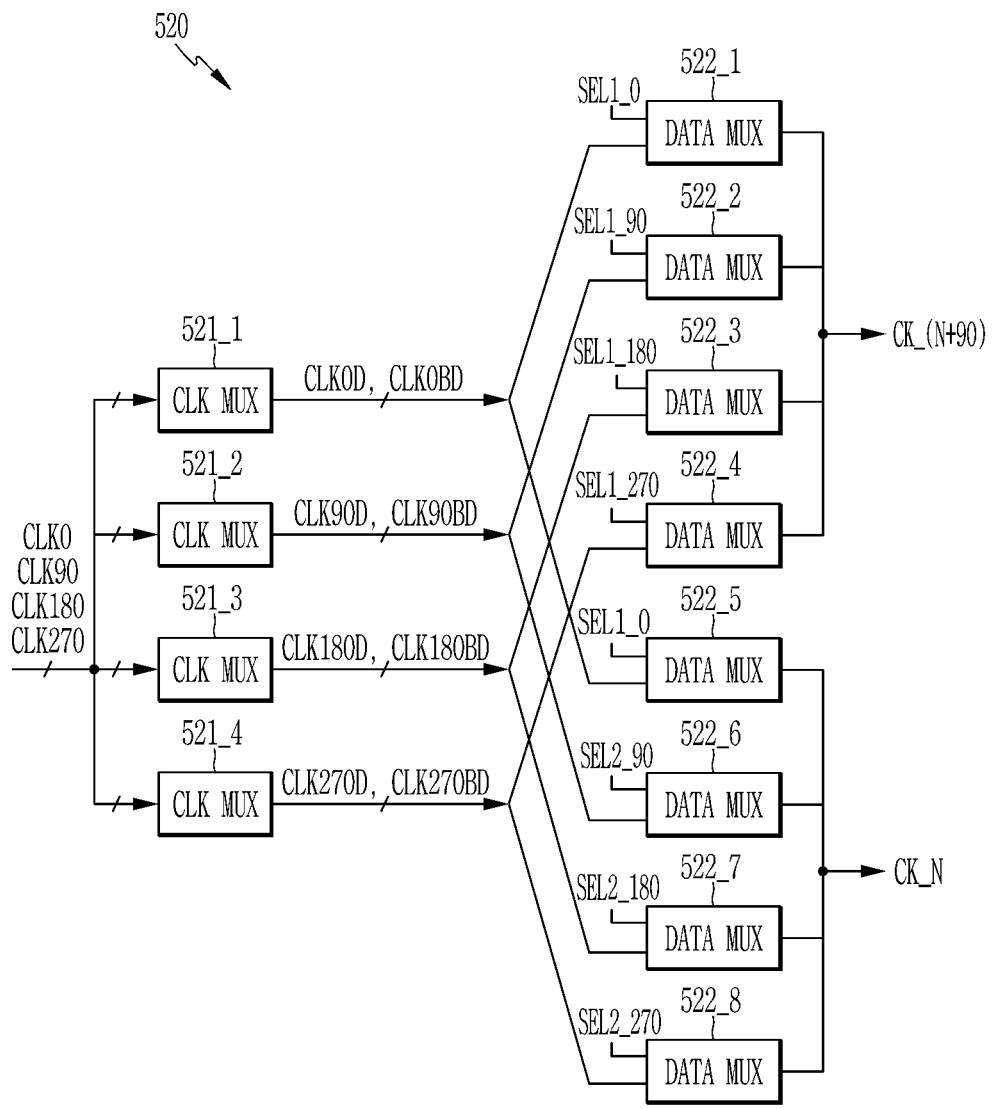
FIG. 13 is a block diagram of a serializer of a phase error correction circuit according to an example embodiment.

FIG. 13 illustrates a block diagram of a serializer of a phase error correction circuit according to an example embodiment.

As shown in FIG. 13, the serializer 520 may comprise a plurality of clock multiplexers 521_1 to 521_4, and a plurality of data multiplexers 522_1 to 522_8. The plurality of clock multiplexers 521_1 to 521_4 shown in FIG. 13 may be the same as the plurality of clock multiplexers 414_1 to 414_5 shown in FIG. 7 described above, so a description thereof is omitted.

The data multiplexer 522_1 may generate an output corresponding to the phase selection signal SEL1_0 among the first selection signal (SEL1[3:0]) according to the delayed clock signal pair (CLK0D, CLK0BD). The data multiplexer 522_2 may generate an output corresponding to the phase selection signal SEL1_90 among the first selection signal (SEL1[3:0]) according to the delayed clock signal pair (CLK90D, CLK90BD). The data multiplexer 522_3 may generate an output corresponding to the phase selection signal SEL1_180 among the first selection signal (SEL1[3:0]) according to the delayed clock signal pair (CLK180D, CLK180BD). The data multiplexer 522_4 may generate an output corresponding to the phase selection signal SEL1_270 among the first selection signal (SEL1[3:0]) according to the delayed clock signal pair (CLK270D, CLK270BD). The outputs of the data multiplexers 522_1 to 522_4 may be combined such that the first clock signal CLK (N+90) may be provided.

The data multiplexer 522_5 may generate an output corresponding to the phase selection signal SEL2_0 among the second selection signal (SEL2[3:0]) according to the delayed clock signal pair (CLK0D, CLK0BD). The data multiplexer 522_6 may generate an output corresponding to the phase selection signal SEL2_90 among the second selection signal (SEL2[3:0]) according to the delayed clock signal pair (CLK90D, CLK90BD). The data multiplexer 522_7 may generate an output corresponding to the phase selection signal SEL2_180 among the second selection signal (SEL2[3:0]) according to the delayed clock signal pair (CLK180D, CLK180BD). The data multiplexer 522_8 may generate an output corresponding to the phase selection signal SEL2_270 among the second selection signal (SEL2 [3:0]) according to the delayed clock signal pair (CLK270D, CLK270BD). The outputs of the data multiplexers 522_5 to 522_8 may be combined such that the second clock signal CLK_N may be provided.

Figure 14:
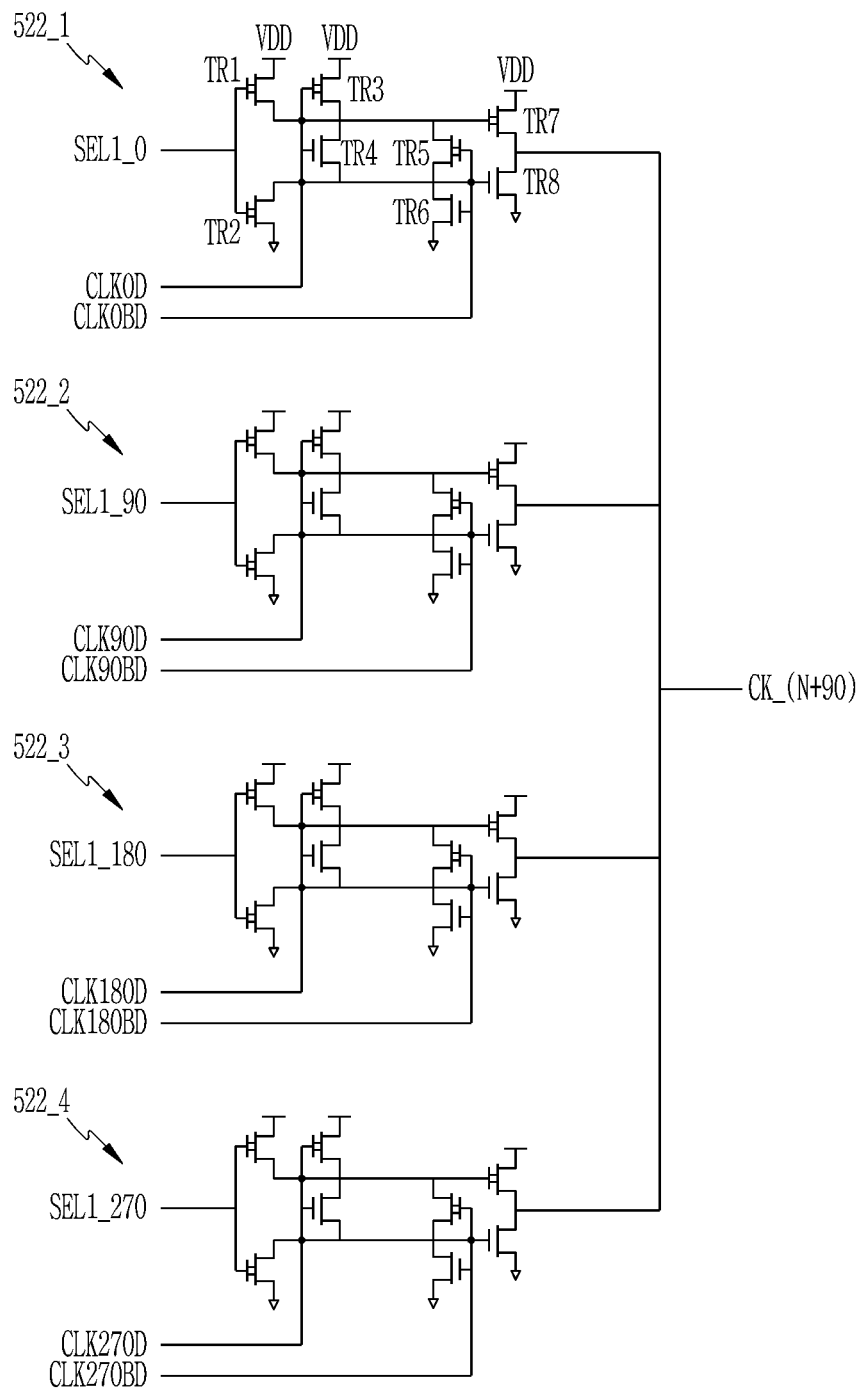
FIG. 14 shows four data multiplexers generating a first clock signal in the serializer of FIG. 13, according to an example embodiment.

FIG. 14 illustrates four data multiplexers generating a first clock signal in the serializer of FIG. 13 according to an example embodiment.

Figure 15:
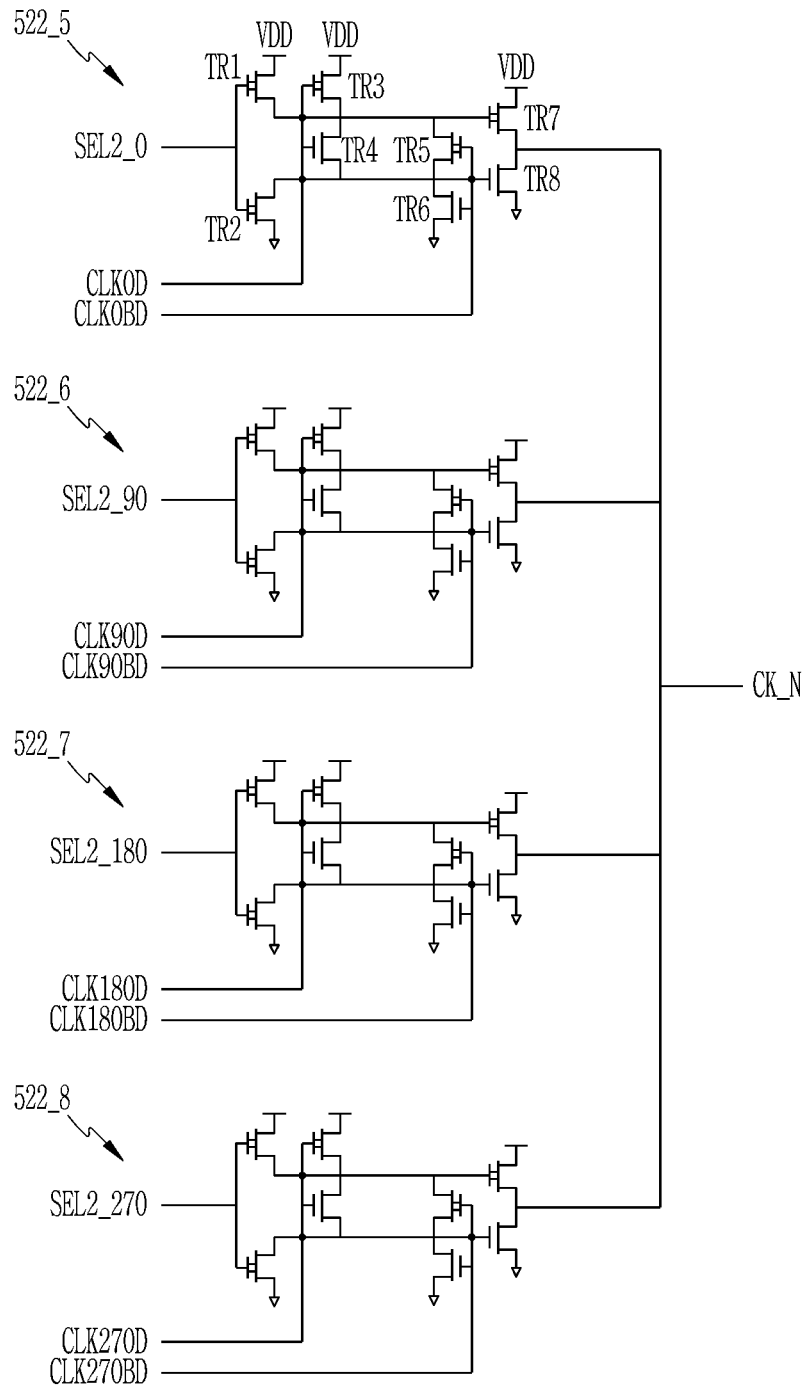
FIG. 15 shows a plurality of data multiplexers generating a second clock signal in the serializer of FIG. 13 according to an example embodiment.

FIG. 15 illustrates a plurality of data multiplexers generating a second clock signal in the serializer of FIG. 13 according to an example embodiment.

For better understanding and ease of description, in FIG. 14 and FIG. 15, the same reference numerals designate components having the same function among configurations of a plurality of data multiplexers.

The four data multiplexers 522_1 to 522_4 shown in FIG. 14 may have the same configuration as the data multiplexers 412_1 to 412_4 shown in FIG. 10. However, instead of data D<0>, D<90>, D<180>, and D<270>, phase selection signals SEL1_0, SEL1_90, SEL1_180, and SEL1_270 may be input to the gates of the transistors TR1 and TR2.

The four data multiplexers 522_5 to 522_8 shown in FIG. 15 may have the same configuration as the data multiplexers 412_1 to 412_4 shown in FIG. 10. However, instead of data D<0>, D<90>, D<180>, and D<270>, phase selection signals SEL2_0, SEL2_90, SEL2_180, and SEL2_270 may be inputted to the gates of the transistors TR1 and TR2.

The phase adjuster 530 may output a delayed clock signal CK ND by delaying the second clock signal CK_N by 1 UI according to the unit delay code CODE_1UI.

The phase error detector 540 may compare phases between the first clock signal CK (N+90) and the delayed clock signal CK ND, and may generate a phase difference signal PD_OUT between the first clock signal CK (N+90) and the delayed clock signal CK ND.

The code generator 550 may generate the correction codes CODE_I, CODE_Q, CODE_IB, and CODE_QB according to the phase difference signal PD_OUT.

The re-timer 560 may generate the first selection signal (SEL1[3:0]) and the second selection signal (SEL2[3:0]) synchronized with each of the four clock signals CLK0, CLK90, CLK180, and CLK270. In an implementation, the re-timer 560 may be synchronized with the first edge of each of the clock signals CLK0, CLK90, CLK180, and CLK270 for each predetermined first period of each of the four clock signals CLK0, CLK90, CLK180, and CLK270 to generate the phase selection signals SEL1_0, SEL1_90, SEL1_180, and SEL1_270 of the first selection signal (SEL1[3:0]) at a masking level for a predetermined period, and may be synchronized with the second edge of each of the clock signals CLK0, CLK90, CLK180, and CLK270 for each predetermined first period of each of the four clock signals CLK0, CLK90, CLK180, and CLK270 to generate the phase selection signals SEL2_0, SEL2_90, SEL2_180, and SEL2_270 of the second selection signal (SEL2[3:0]) at a masking level for a predetermined period. In this case, there may be a phase difference between the first edge and the second edge of each of the clock signals CLK0, CLK90, CLK180, and CLK270 by a predetermined second period of each of the clock signals CLK0, CLK90, CLK180, and CLK270.

Figure 16:
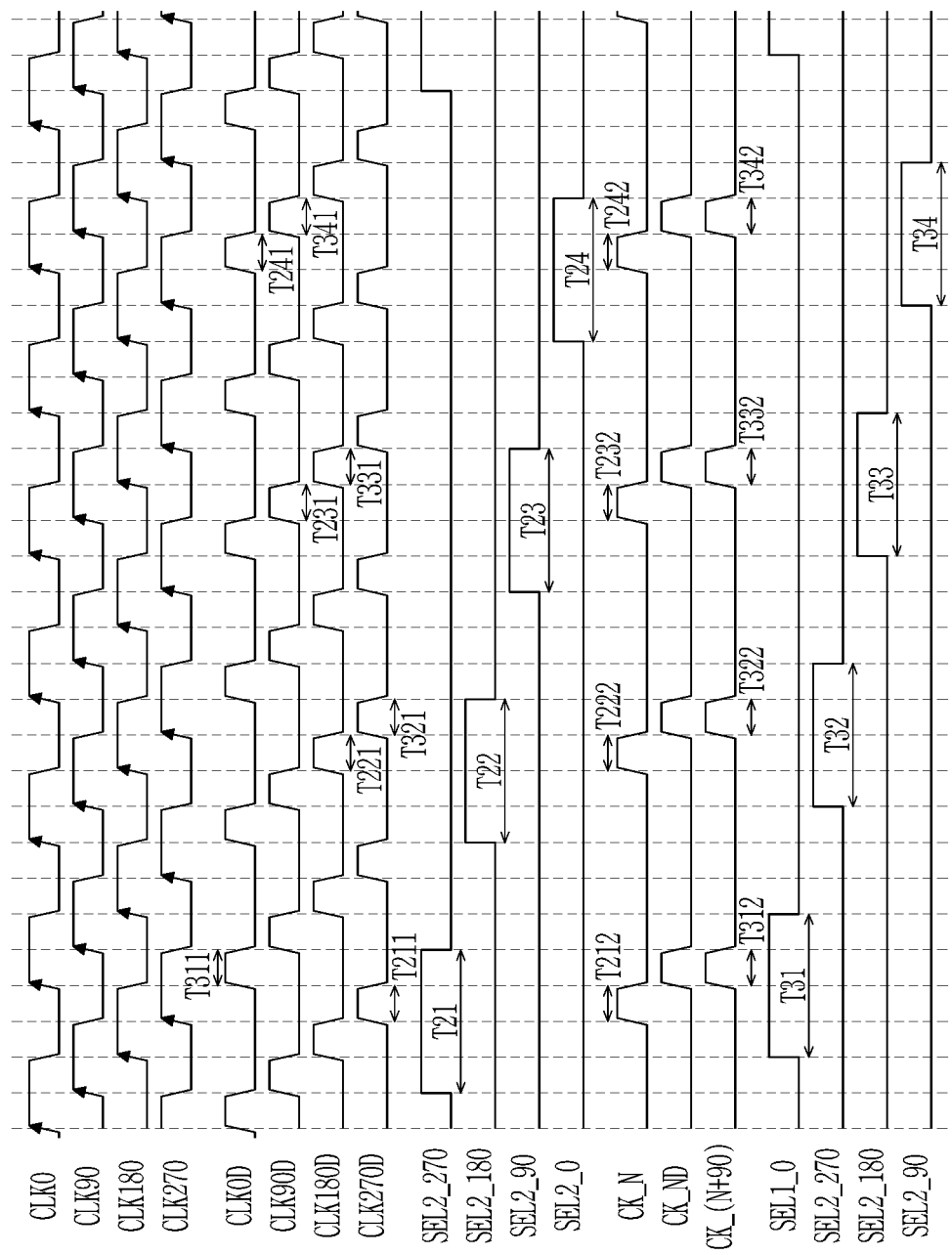
FIG. 16 shows waveform diagrams of four delayed clock signal pairs, a first selection signal, and a second selection signal according to an example embodiment.

FIG. 16 illustrates waveform diagrams of four delayed clock signal pairs, a first selection signal, and a second selection signal according to an example embodiment. In the waveform diagram of FIG. 16, a masking level of the phase selection signal may be a high level, a predetermined period during which the masking level is maintained may be one period of the clock signals CLK0, CLK90, CLK180, and CLK270, the first period may be 7 periods of the clock signal, and the second period may be 2 periods of the clock signal. However, the waveform diagram of FIG. 16 is an example for explaining the embodiment.

In a period T21, when the phase selection signal SEL2_270 of the second selection signal (SEL2[3:0]) is at the masking level, in the data multiplexer 522_8, the transistor TR2 may be turned on for the period T21 according to the phase selection signal SEL2_270. In a period T211, when the transistor TR4 is turned on by the high level of the delayed clock signal CLK270D, the transistor TR7 may be turned on such that the voltage VDD may be outputted during the period T212, and the second clock signal CLK_N may be at a high level according to the voltage VDD. In a period T31, when the phase selection signal SEL1_0 of the first selection signal (SEL1[3:0]) is at the masking level, and in the data multiplexer 522_1, the transistor TR2 may be turned on for the period T31 according to the phase selection signal SEL1_0. In a period T211, when the transistor TR4 is turned on by the high level of the delayed clock signal CLK0D, the transistor TR7 may be turned on such that the voltage VDD may be outputted during the period T312, and the first clock signal CLK (N+1) may be at a high level according to the voltage VDD. The phase selection signal SEL2_270 may rise in synchronization with the falling edge of the clock signal CLK270, and the phase selection signal SEL1_0 may rise in synchronization with the falling edge of the clock signal CLK0.

In a period T22, when the phase selection signal SEL2_180 of the second selection signal (SEL2[3:0]) is at the masking level, in the data multiplexer 522_7, the transistor TR2 is turned on for the period T22 according to the phase selection signal SEL2_180. In a period T221, when the transistor TR4 is turned on by the high level of the delayed clock signal CLK180D, the transistor TR7 is turned on such that the voltage VDD may be outputted during the period T222, and the second clock signal CLK_N may be at a high level according to the voltage VDD. In a period T32, when the phase selection signal SEL1_270 of the first selection signal (SEL1[3:0]) is at the masking level, in the data multiplexer 522_4, the transistor TR2 may be turned on for the period T32 according to the phase selection signal SEL1_270. In a period T321, when the transistor TR4 is turned on by the high level of the delayed clock signal CLK270D, the transistor TR7 is turned on such that the voltage VDD may be outputted during the period T322, and the first clock signal CLK (N+90) may be at a high level according to the voltage VDD. The phase selection signal SEL2_180 may rise in synchronization with the falling edge of the clock signal CLK180, and the phase selection signal SEL1_270 may rise in synchronization with the falling edge of the clock signal CLK270.

In a period T23, when the phase selection signal SEL2_90 of the second selection signal (SEL2[3:0]) is at the masking level, in the data multiplexer 522_6, the transistor TR2 may be turned on for the period T23 according to the phase selection signal SEL2_90. In a period T231, when the transistor TR4 is turned on by the high level of the delayed clock signal CLK90D, the transistor TR7 may be turned on such that the voltage VDD may be outputted during the period T232, and the second clock signal CLK_N may be at a high level according to the voltage VDD. In a period T33, when the phase selection signal SEL1_180 of the first selection signal (SEL1[3:0]) is at the masking level, in the data multiplexer 522_3, the transistor TR2 may be turned on for the period T33 according to the phase selection signal SEL1_180. In a period T331, when the transistor TR4 is turned on by the high level of the delayed clock signal CLK180D, the transistor TR7 may be turned on such that the voltage VDD may be outputted during the period T332, and the first clock signal CLK (N+90) may be at a high level according to the voltage VDD. The phase selection signal SEL2_90 may rise in synchronization with the falling edge of the clock signal CLK90, and the phase selection signal SEL1_180 may rise in synchronization with the falling edge of the clock signal CLK180.

In a period T24, when the phase selection signal SEL2_0 of the second selection signal (SEL2[3:0]) is at the masking level, in the data multiplexer 522_5, the transistor TR2 may be turned on for the period T24 according to the phase selection signal SEL2_0. In a period T241, when the transistor TR4 is turned on by the high level of the delayed clock signal CLK0D, the transistor TR7 may be turned on such that the voltage VDD may be outputted during the period T242, and the second clock signal CLK_N may be at a high level according to the voltage VDD. In a period T34, when the phase selection signal SEL1_90 of the first selection signal (SEL1[3:0]) is at the masking level, in the data multiplexer 522_2, the transistor TR2 may be turned on for the period T34 according to the phase selection signal SEL1_90. In a period T341, when the transistor TR4 is turned on by the high level of the delayed clock signal CLK90D, the transistor TR7 may be turned on such that the voltage VDD may be outputted during the period T342, and the first clock signal CLK (N+90) may be at a high level according to the voltage VDD. The phase selection signal SEL2_0 may rise in synchronization with the falling edge of the clock signal CLK0, and the phase selection signal SEL1_90 may rise in synchronization with the falling edge of the clock signal CLK90.

As shown in FIG. 16, the second clock signal CK_N may be delayed by 1 UI by the phase adjuster 530 to become the unit delayed clock signal CK ND.

The phase error detector 540 may detect a phase difference by comparing the phases between the first clock signal CK (N+90) and the unit delayed clock signal CK ND, and may generate the phase difference signal PD_OUT indicating the detected phase difference. In an implementation, the phase error detector 540 may increase the phase difference signal PD_OUT when the phase of the first clock signal CK (N+90) is ahead of the phase of the unit delayed clock signal CK ND (when the edge of the first clock signal CK (N+90) is ahead of the edge of the unit delayed clock signal CK ND), and the phase error detector 540 may decrease the phase difference signal PD_OUT when the phase of the first clock signal CK (N+90) is later than the unit delayed clock signal CK ND (when the edge of the first clock signal CK (N+90) is later than the edge of the unit delayed clock signal CK ND).

According to the decrease or increase of the phase difference signal PD_OUT between the first clock signal CK (N+90) corresponding to the 0 degree phase and the unit delayed clock signal CK ND in the period T31, the code generator 550 may increase or decrease the correction code CODE_Q. When the correction code CODE_Q increases as the phase difference signal PD_OUT decreases, the phase delay amount of the clock signal CK90 may increase when the clock signal CK90 is generated. Then, the phase of the clock signal CK270 having the inverted phase of the clock signal CK90 may be delayed. When the correction code CODE_Q decreases as the phase difference signal PD_OUT increases, the phase delay amount of the clock signal CK90 may decrease when the clock signal CK90 is generated. Then, the phase of the clock signal CK270 having the inverted phase of the clock signal CK90 may be advanced.

According to the decrease or increase of the phase difference signal PD_OUT between the first clock signal CK (N+90) corresponding to the 270 degree phase and the unit delayed clock signal CK ND in the period T32, the code generator 550 may decrease or increase the correction code CODE_QB. When the correction code CODE_QB decreases as the phase difference signal PD_OUT decreases, the duty cycle of the clock signal CK90 may decrease when the clock signal CK90 is generated. Then, the rising edge of the clock signal CK270 may be advanced, so that the phase of the clock signal CK270 may be advanced. When the correction code CODE_QB increases as the phase difference signal PD_OUT increases, the duty cycle of the clock signal CK90 may increase when the clock signal CK90 is generated. Then, the rising edge of the clock signal CK270 may be delayed, so that the phase of the clock signal CK270 may be delayed.

According to the decrease or increase of the phase difference signal PD_OUT between the first clock signal CK (N+90) corresponding to the 180 degree phase and the unit delayed clock signal CK ND in the period T33, the code generator 550 may decrease or increase the correction code CODE_IB. When the correction code CODE_IB decreases as the phase difference signal PD_OUT decreases, the duty cycle of the clock signal CK0 may decrease when the clock signal CK0 is generated. Then, the rising edge of the clock signal CK180 may be advanced, so that the phase of the clock signal CK180 may be advanced. When the correction code CODE_IB increases as the phase difference signal PD_OUT increases, the duty cycle of the clock signal CK0 may increase when the clock signal CK0 is generated. Then, the rising edge of the clock signal CK180 may be delayed, so that the phase of the clock signal CK180 may be delayed.

According to the decrease or increase of the phase difference signal PD_OUT between the first clock signal CK (N+90) corresponding to the 90 degree phase and the unit delayed clock signal CK ND in the period T34, the code generator 550 may decrease or increase the correction code CODE_Q. When the correction code CODE_Q decreases as the phase difference signal PD_OUT decreases, the phase of the clock signal CK90 is delayed less when the clock signal CK90 is generated, so that the phase of the clock signal CK90 may be advanced. When the correction code CODE_Q increases as the phase difference signal PD_OUT increases, the phase of the clock signal CK90 may be further delayed when the clock signal CK90 is generated, so that the phase of the clock signal CK90 may be delayed.

The correction code CODE_I may adjust a phase offset when the clock signal CLK0 of the 0 degree phase is generated. The correction code CODE_I may be maintained at a fixed value, and the code generator 550 may adjust the correction code CODE_I only when an arbitrary offset condition is satisfied.

The code generator 550 may also generate the unit delay code CODE_1UI indicating 1UI together with the correction code.

Figure 17:
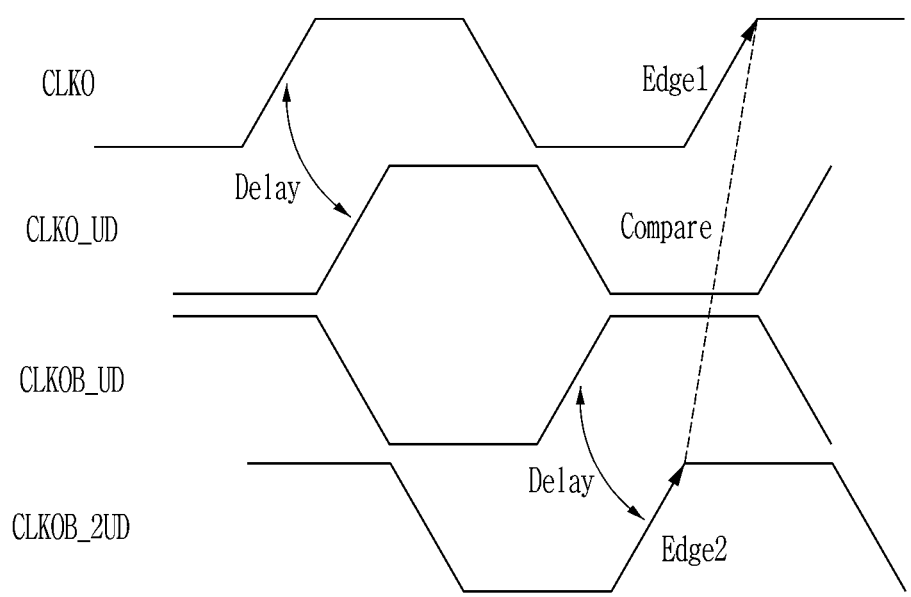
FIG. 17 is a waveform diagram of a clock signal used to determine a unit delay code according to an example embodiment.

FIG. 17 illustrates a waveform diagram of a clock signal used to determine a unit delay code according to an example embodiment.

Figure 18:
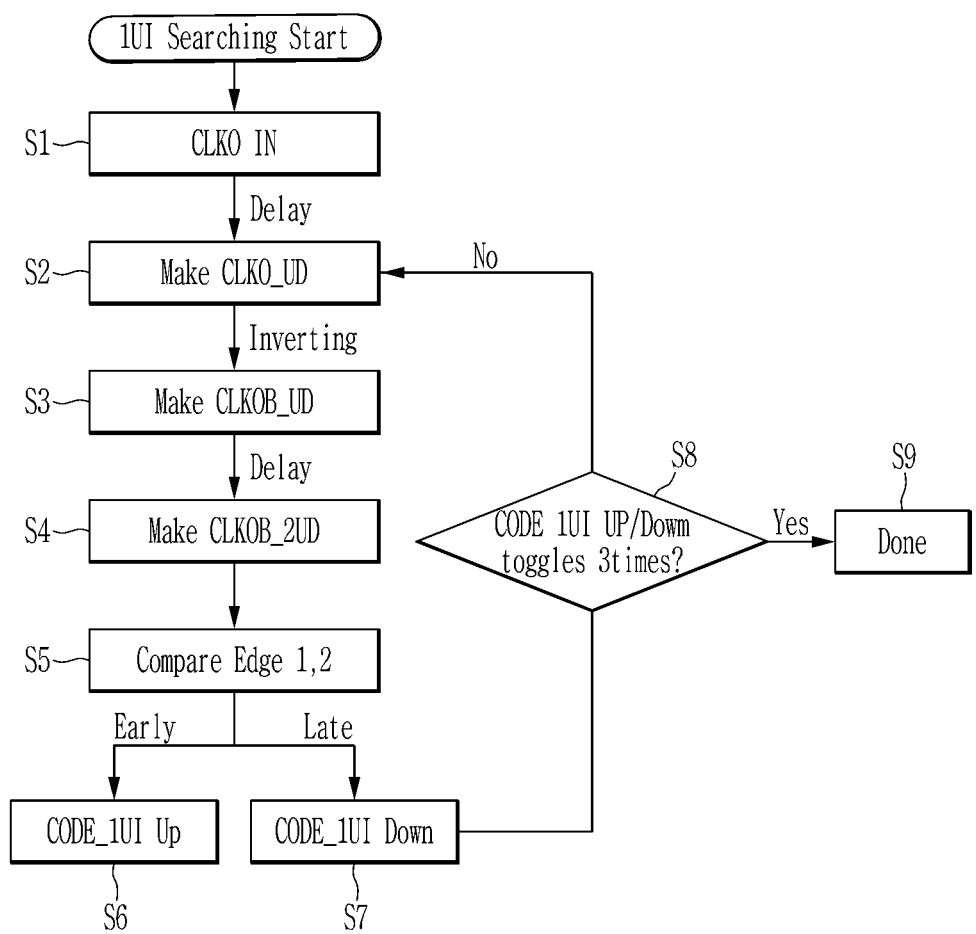
FIG. 18 is a flowchart of a unit delay code determining method according to an example embodiment.

FIG. 18 illustrates a flowchart of a unit delay code determining method according to an example embodiment.

The code generator 550 may receive the clock signal CLK0 from the clock generation circuit 510 to determine the unit delay code (S1).

The code generator 550 may generate a signal CLK0_UD by delaying the clock signal CLK0 by a predetermined delay period T_UD (S2). In this case, the delay period T_UD may be determined according to the unit delay code.

The code generator 550 may generate an inverted signal CLK0B_UD by inverting the signal CLK0_UD (S3).

The code generator 550 may generate a delayed inverted signal CLK0B_2UD by delaying the inverted signal CLKB_UD by a predetermined period T_UD (S4).

The code generator 550 may compare a rising edge (Edge1) of the signal CLK0 with a rising edge (Edge2) of the delayed inverted signal CLK0B_2UD (S5).

When the rising edge of the compared result signal CLK0 in step S5 precedes the delay inverted signal CLK0B_2UD, the unit delay code CODE_1UI may be increased to increase the delay period T_UD (S6).

When the rising edge of the compared result signal CLK0 in step S5 is later than the delayed inverted signal CLK0B_2UD, the unit delay code CODE_1UI may be decreased to decrease the delay period T_UD (S7).

The code generator 550 may determine whether the toggle of the unit delay code CODE_1UI is continuously repeated three times (S8).

As a result of the determination in step S8, when the unit delay code CODE_1UI is continuously toggled three times, the code generator 550 may determine the unit delay code CODE_1UI (S9). Toggling the unit delay code CODE_1UI may mean increasing and decreasing the unit delay code CODE_1UI. The fact that the unit delay code CODE_1UI is continuously toggled three times may be regarded as the unit delay period 1UI repeatedly moving three times in succession based on a predetermined target value. Therefore, it can be considered that the search for the unit delay period is completed. However, the number of the toggles is a value that may be arbitrarily set and may be three or more.

As a result of the determination in step S8, when the unit delay code CODE_1UI is not continuously toggled three times, steps from step S2 may be repeated.

In the embodiment of FIG. 3 described above, each of the plurality of clock generation circuits 340 may provide the four clock signals CLK0, CLK90, CLK180, and CLK270 to each of the plurality of DQ driving circuits 350. In contrast, the plurality of clock generation circuits 340 may provide the four clock signals CLK0, CLK90, CLK180, and CLK270 to at least two DQ driving circuits.

Figure 19:
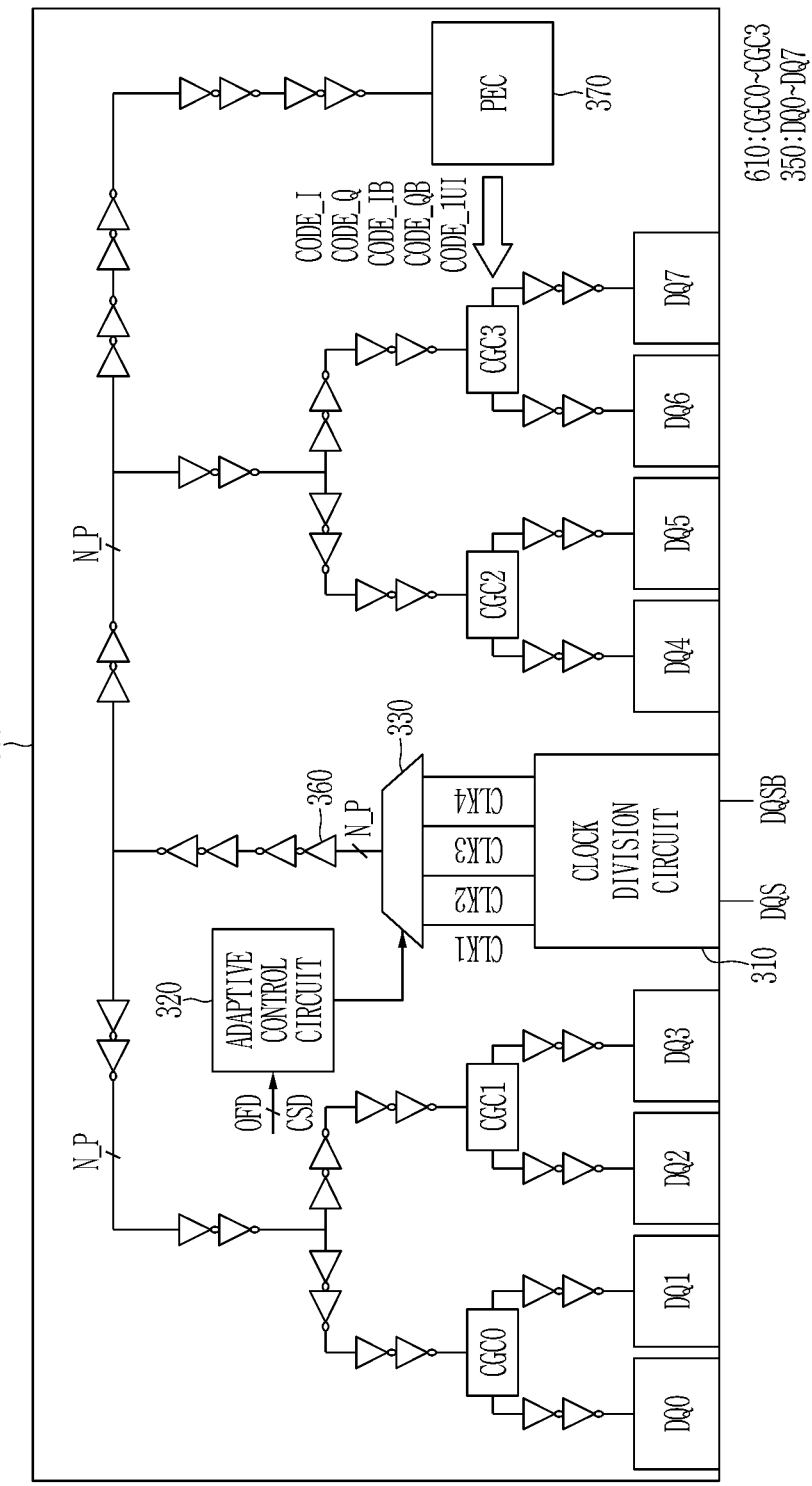
FIG. 19 is a schematic diagram showing a portion of a memory interface of a semiconductor memory device according to an example embodiment.

FIG. 19 schematically illustrates a portion of a memory interface of a semiconductor memory device according to an example embodiment.

As shown in FIG. 19, a memory interface 600 may comprise the clock division circuit 310, the adaptive control circuit 320, the clock selection circuit 330, a plurality of clock generation circuits 610, the plurality of DQ driving circuits 350, the plurality of inverters 360, and the phase error correction circuit 370. Among components of the embodiment shown in FIG. 19, the same reference numerals designate the same components as those of the embodiment shown in FIG. 3. Hereinafter, descriptions of components overlapping with the embodiment of FIG. 3 will be omitted.

Each of the plurality of clock generation circuits 610 may be positioned at a node from which a channel branches to two adjacent DQ driving circuits among the plurality of DQ driving circuits 350. In an implementation, a clock generation circuit CGC0 may generate the four clock signals CLK0, CLK90, CLK180, and CLK270 to provide them to two DQ driving circuits DQ0 and DQ1. A clock generation circuit CGC1 may generate the four clock signals CLK0, CLK90, CLK180, and CLK270 to provide them to two DQ driving circuits DQ2 and DQ3. A clock generation circuit CGC2 may generate the four clock signals CLK0, CLK90, CLK180, and CLK270 to provide them to two DQ driving circuits DQ4 and DQS. A clock generation circuit CGC3 may generate the four clock signals CLK0, CLK90, CLK180, and CLK270 to provide them to two DQ driving circuits DQ6 and DQ7. A configuration of each of the plurality of clock generation circuits 610 may be implemented as the clock generation circuit shown in FIG. 5.

Figure 20:
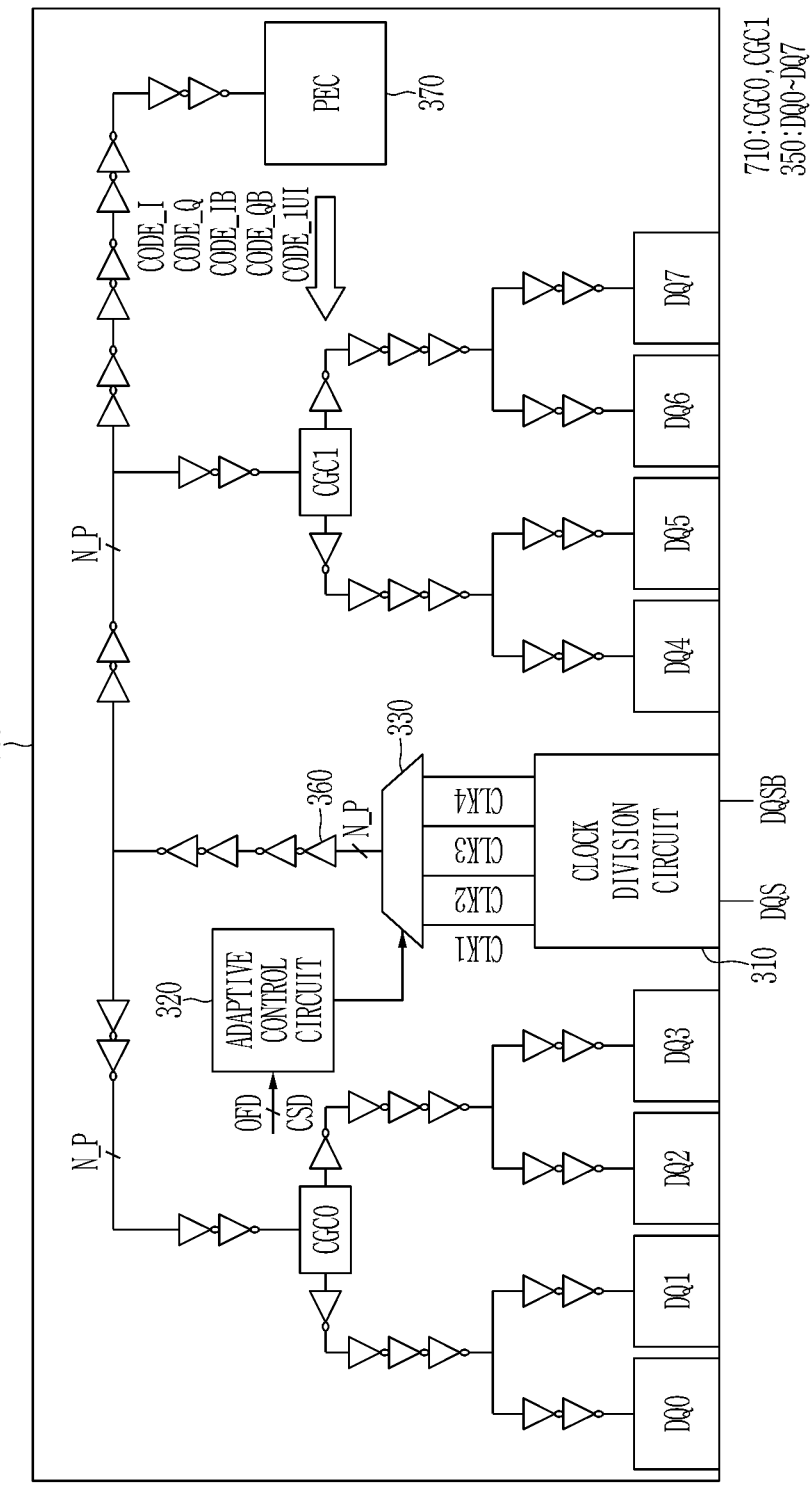
FIG. 20 is another schematic diagram showing a portion of a memory interface of a semiconductor memory device according to an example embodiment.

FIG. 20 schematically illustrates a portion of a memory interface of a semiconductor memory device according to an example embodiment.

As shown in FIG. 20, a memory interface 700 may comprise the clock division circuit 310, the adaptive control circuit 320, the clock selection circuit 330, a plurality of clock generation circuits 710, the plurality of DQ driving circuits 350, the plurality of inverters 360, and the phase error correction circuit 370. Among components of the embodiment shown in FIG. 20, the same reference numerals designate the same components as those of the embodiment shown in FIG. 3. Hereinafter, descriptions of components overlapping with the embodiment of FIG. 3 will be omitted.

Each of the plurality of clock generation circuits 710 may be positioned at a node from which a channel branches to four adjacent DQ driving circuits among the plurality of DQ driving circuits 350. In an implementation, a clock generation circuit CGC0 may generate the four clock signals CLK0, CLK90, CLK180, and CLK270 to provide them to four DQ driving circuits DQ0, DQ1, DQ2, and DQ3. A clock generation circuit CGC1 may generate the four clock signals CLK0, CLK90, CLK180, and CLK270 to provide them to four DQ driving circuits DQ4, DQS, DQ6, and DQ7. A configuration of each of the plurality of clock generation circuits 710 may be implemented as the clock generation circuit shown in FIG. 5.

Figure 21:
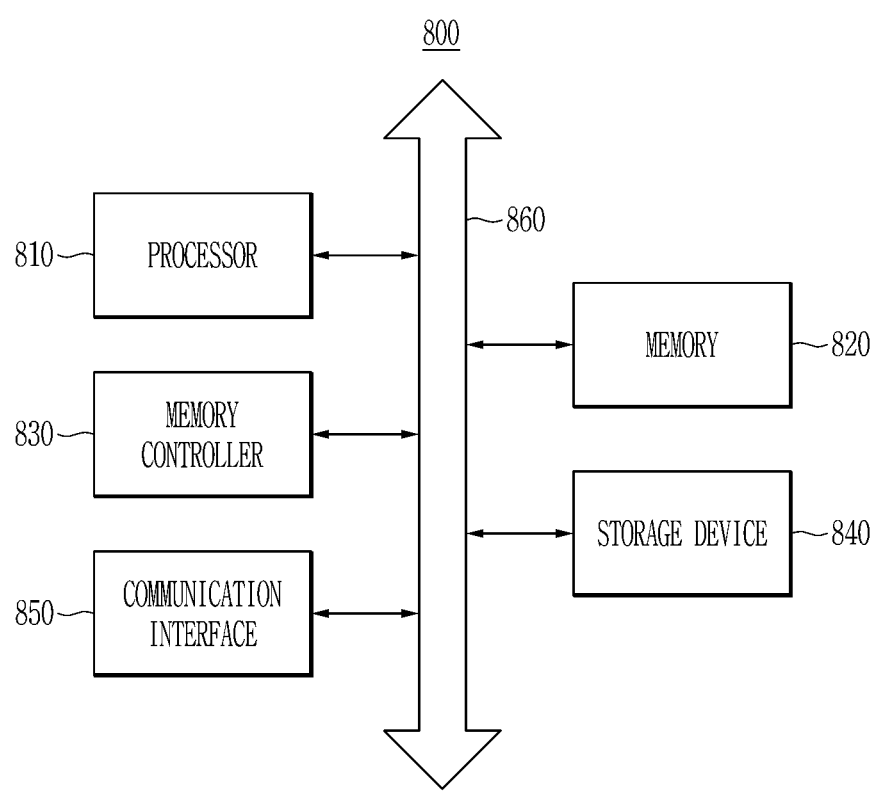
FIG. 21 is a block diagram of a computer system according to an example embodiment.

FIG. 21 illustrates a block diagram of a computer system according to an example embodiment.

Referring to FIG. 21, a computing system 800 comprises a processor 810, a memory 820, a memory controller 830, a storage device 840, a communication interface 850, and a bus 860. The computing system 800 may further comprise other general-purpose constituent elements.

The processor 810 may control an overall operation of each constituent element of the computing system 800. The processor 810 may be implemented as various processing units such as a central processing unit (CPU), an application processor (AP), or a graphics processing unit (GPU).

The memory 820 may store various data and commands. The memory 820 may be implemented as the memory device described with reference to FIG. 1 to FIG. 20. The memory controller 830 may control transmission of data or commands to and from the memory 820. The memory controller 830 may be implemented as the memory controller described with reference to FIG. 1 to FIG. 20. In some embodiments, the memory controller 830 may be provided as a separate chip from the processor 810. In some embodiments, the memory controller 830 may be provided as an internal configuration of the processor 810.

The storage device 840 may non-temporarily store programs and data. In some embodiments, the storage device 840 may be implemented as a non-volatile memory. The communication interface 850 may support wired and wireless Internet communication of the computing system 800. The communication interface 850 may support various communication methods other than internet communication. The bus 860 may provide a communication function between constituent elements of the computing system 800. The bus 860 may comprise at least one type of bus according to a communication protocol between the constituent elements.

In some embodiments, each constituent element or a combination of two or more constituent elements described with reference to FIG. 1 to FIG. 21 may be implemented as a digital circuit, a programmable or non-programmable logic device or array, or an application specific integrated circuit (ASIC).

By way of summation and review, as an input/output (I/O) speed between the memory device and the memory controller increases, power consumption of the semiconductor device increases. Among a total amount of power consumed in the input/output between the memory device and the memory controller, an amount of power required to transmit an internal clock signal in the memory device accounts for a significant amount thereof.

A memory interface, and a semiconductor memory device and semiconductor device including the same that may reduce an amount of power consumed for clock signal transmission.

The present disclosure has been made in an effort to provide a memory interface, and a semiconductor memory device and semiconductor device including the same that may correct a phase error between clock signals that is generated in generating a clock signal.

The drawings and description are to be regarded as illustrative in nature and not restrictive. Like reference numerals designate like elements throughout the specification. Like reference numerals designate like elements throughout the specification. In the flowcharts described with reference to the drawings in this specification, the operation order may be changed, various operations may be merged, certain operations may be divided, and certain operations may not be performed.

In addition, a singular form may be intended to comprise a plural form as well, unless the explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a memory controller configured to provide a data strobe signal; and
 a memory device configured to receive a data signal provided from the memory controller or output a data signal to the memory controller,
 wherein the memory device includes:
 a memory interface including a plurality of DQ driving circuits, the memory interface being configured to:
 generate m phase clock signals based on the data strobe signal, where m is an integer equal to two or more,
 determine a number n of the m phase clock signals to be provided to the plurality of DQ driving circuits based on an operating frequency of the memory device, where n is an integer equal to 1 or more, and
 provide the n phase clock signals to the plurality of DQ driving circuits.

2. The semiconductor device as claimed in claim 1, wherein the memory interface further includes:
 a first clock generation circuit configured to receive the n phase clock signals, wherein n is less than m, and generate and provide to the plurality of DQ driving circuits m phase clock signals using the received n phase clock signals.

3. The semiconductor device as claimed in claim 2, wherein the memory interface is configured to provide the n phase clock signals to a phase error correction circuit, wherein the memory interface further includes:
 the phase error correction circuit, the phase error correction circuit being configured to generate a correction code according to a phase difference between two of the m phase clock signals and to provide the correction code to the first clock generation circuit, and
 wherein the first clock generation circuit is configured to adjust a phase or a duty cycle of a corresponding clock signal among the received n phase clock signals according to the correction code.

4. The semiconductor device as claimed in claim 3, wherein
 the phase error correction circuit includes a serializer configured to multiplex the received n clock signals to generate a plurality of delayed clock signal pairs, mask one of a plurality of first delayed clock signals according to a first selection signal to output it as a first clock signal, and mask one of the plurality of first delayed clock signals according to a second selection signal to output it as a second clock signal, and
 the plurality of delayed clock signal pairs includes the plurality of first delayed clock signals and a plurality of second delayed clock signals having an inverted phase with respect to the plurality of first delayed clock signals.

5. The semiconductor device as claimed in claim 4, wherein
 the phase error correction circuit is configured to adjust the correction code according to a phase difference between a unit delayed clock signal obtained by delaying the second clock signal and the first clock signal.

6. The semiconductor device as claimed in claim 5, wherein
the phase error correction circuit is configured to adjust the correction code according to a phase difference between the unit delayed clock signals for the first clock signal corresponding to a 0 degree phase and the second clock signal corresponding to a 270 degree phase, and
the clock generation circuit is configured to adjust a phase delayed amount of the clock signal of a 90 degree phase according to the correction code.

7. The semiconductor device as claimed in claim 5, wherein
the phase error correction circuit is configured to adjust the correction code according to a phase difference between the unit delayed clock signals for the first clock signal corresponding to a 270 degree phase and the second clock signal corresponding to a 180 degree phase, and
the clock generation circuit is configured to adjust a duty cycle of the clock signal of a 90 degree phase according to the correction code.

8. The semiconductor device as claimed in claim 5, wherein
the phase error correction circuit is configured to adjust the correction code according to a phase difference between the unit delayed clock signals for the first clock signal corresponding to a 180 degree phase and the second clock signal corresponding to a 90 degree phase, and
the clock generation circuit is configured to adjust a duty cycle of the clock signal of a 0 degree phase according to the correction code.

9. The semiconductor device as claimed in claim 5, wherein
the phase error correction circuit is configured to adjust the correction code according to a phase difference between the unit delayed clock signals for the first clock signal corresponding to a 90 degree phase and the second clock signal corresponding to a 0 degree phase, and
the clock generation circuit is configured to adjust a phase delayed amount of the clock signal of the 90 degree phase according to the correction code.

10. The semiconductor device as claimed in claim 3, wherein the phase error correction circuit further includes a code generator configured to delay a clock signal of a first phase among the plurality of clock signals by a delay period to generate a first phase delayed clock signal, invert the first phase delayed clock signal to generate a first phase inverted delayed clock signal, delay the first phase inverted delayed clock signal by the delay period to generate a clock signal a second phase, and compare a first edge of the clock signal of the first phase and a second edge of the clock signal of the second phase to determine a unit delay code indicating the delay period.

11. The semiconductor device as claimed in claim 10, wherein
the code generator is configured to adjust the unit delay code to increase the delay period when the first edge is ahead of the second edge as the compared result, and
the code generator is configured to adjust the unit delay code to decrease the delay period when the first edge is later than the second edge as the compared result.

12. The semiconductor device as claimed in claim 1, wherein the memory interface further includes:

a clock division circuit configured to generate the m phase clock signals by using the data strobe signal;
a clock selection circuit configured to select and output the n phase clock signals provided to the plurality of DQ driving circuits from the m phase clock signals; and
a plurality of clock generation circuits each being configured to receive the n phase clock signals, and generate m phase clock signals using the received phase clock signals and to provide the generated m plurality of clock signals to a corresponding one of the plurality of DQ driving circuits
wherein each of the plurality of clock generation circuits is positioned in a corresponding channel among a plurality of channels between the clock selection circuit and the plurality of DQ driving circuits, and the number of the plurality of clock generation circuits is smaller than or equal to the number of the plurality of DQ driving circuits.

13. The semiconductor device as claimed in claim 12, wherein the memory interface further includes an adaptive control circuit configured to determine the number n of phase clock signals to be transmitted to the plurality of DQ driving circuits among the m phase clock signals based on the operating frequency and channel state information of a plurality of channels between the clock selection circuit and the plurality of DQ driving circuits.

14. A semiconductor memory device, comprising:
a memory cell array including a plurality of memory cells;
a plurality of DQ driving circuits configured to convert data read from the memory cell array according to a plurality of clock signals to generate a data signal and sample an externally received data signal according to the plurality of clock signals;
an adaptive control circuit configured to determine a number n of phase clock signals according to an operating frequency, where n is an integer equal or greater to 1;
a clock selection circuit configured to provide n phase clock signals based on an externally received data strobe signal; and
a plurality of clock generation circuits configured to receive the n phase clock signals to generate the plurality of clock signals.

15. The semiconductor memory device as claimed in claim 14,
wherein the clock selection circuit is configured to provide the n phase clock signals to a phase error correction circuit,
wherein the semiconductor memory device further comprises the phase error correction circuit, the phase error correction circuit being configured to generate a correction code according to a phase difference between two clock signals of m clock signals, where m is an integer greater than 2, and to provide the correction code to the plurality of clock generation circuits, and
wherein each of the plurality of clock generation circuits is configured to adjust a phase or a duty cycle of a corresponding clock signal among the received n clock signals according to the correction code.

16. The semiconductor memory device as claimed in claim 14, wherein
the adaptive control circuit is configured to determine the number n of phase clock signals to be provided based on the operating frequency and channel state information of a plurality of channels, and the plurality of channels are positioned between the clock selection circuit and the plurality of DQ driving circuits.

17. The semiconductor memory device as claimed in claim 14, wherein each of the plurality of clock generation circuits is configured to generate, when the number n of phase clock signals is one, a clock signal of a 0 degree phase and a clock signal of a 180 degree phase based on the one phase clock signal, and delay the one phase clock signal to generate a clock signal of a 90 degree phase and a clock signal of a 270 degree phase.

18. The semiconductor memory device as claimed in claim 14, wherein each of the plurality of clock generation circuits is configured to generate, when the number n of phase clock signals is two, a clock signal of a 0 degree phase and a clock signal of a 180 degree phase based on one of the two phase clock signals, and generate a clock signal of a 90 degree phase and a clock signal of a 270 degree phase based on the other of the two phase clock signals.

19. A memory interface, comprising:
a DQ driving circuit configured to drive a data signal;
a clock division circuit configured to generate m phase clock signals based on an externally received data strobe signal, where m is an integer greater than 2;
an adaptive control circuit configured to determine a number of n of the m phase clock signals to be transmitted to the DQ driving circuit according to an operating frequency, where n is an integer equal to one or more; and
a clock generation circuit configured to receive n phase clock signals and configured to generate m phase clock signals and provide the generated m phase clock signals to the DQ driving circuit,
wherein the DQ driving circuit is configured to drive the data signal according to the m phase clock signals received from the clock generation circuit.

20. The memory interface as claimed in claim 19, wherein the clock generation circuit is configured to generate, when the number of n phase clock signals is one, a clock signal of a 0 degree phase and a clock signal of a 180 degree phase based on the one phase clock signal, and delay the one phase clock signal to generate a clock signal of a 90 degree phase and a clock signal of a 270 degree phase.

* * * * *